United States Patent
Roberts et al.

(10) Patent No.: US 11,569,428 B2
(45) Date of Patent: Jan. 31, 2023

(54) SUPERCONDUCTING QUBIT DEVICE PACKAGES

(71) Applicant: Intel Corporation, Santa Clara, CA (US)

(72) Inventors: Jeanette M. Roberts, North Plains, OR (US); Adel A. Elsherbini, Chandler, AZ (US); Shawna Liff, Scottsdale, AZ (US); Johanna M. Swan, Scottsdale, AZ (US); Roman Caudillo, Portland, OR (US); Zachary R. Yoscovits, Beaverton, OR (US); Nicole K. Thomas, Portland, OR (US); Ravi Pillarisetty, Portland, OR (US); Hubert C. George, Portland, OR (US); James S. Clarke, Portland, OR (US)

(73) Assignee: Santa Clara

( * ) Notice: Subject to any disclaimer, the term of this patent is extended or adjusted under 35 U.S.C. 154(b) by 275 days.

(21) Appl. No.: 16/347,097

(22) PCT Filed: Dec. 27, 2016

(86) PCT No.: PCT/US2016/068629
§ 371 (c)(1),
(2) Date: May 2, 2019

(87) PCT Pub. No.: WO2018/125026
PCT Pub. Date: Jul. 5, 2018

(65) Prior Publication Data
US 2019/0273197 A1     Sep. 5, 2019

(51) Int. Cl.
*H01L 27/32*     (2006.01)
*H01L 39/04*     (2006.01)
(Continued)

(52) U.S. Cl.
CPC ........... *H01L 39/045* (2013.01); *G06N 10/00* (2019.01); *H01L 23/48* (2013.01); *H01L 24/13* (2013.01);
(Continued)

(58) Field of Classification Search
CPC ....... H01L 39/045; H01L 23/48; H01L 24/13; H01L 25/00; H01L 27/18; H01L 39/025;
(Continued)

(56) References Cited

U.S. PATENT DOCUMENTS

| | | |
|---|---|---|
| 2009/0173936 A1 | 7/2009 | Bunyk |
| 2012/0074386 A1 | 3/2012 | Rachmady et al. |

(Continued)

FOREIGN PATENT DOCUMENTS

| | | |
|---|---|---|
| WO | 2017155531 A1 | 9/2017 |
| WO | 2017213638 A1 | 12/2017 |

(Continued)

OTHER PUBLICATIONS

PCT/US2017/037808, Jun. 16, 2017, Low Loss High Isolation First Level Interconnect for Quantum Computing.
(Continued)

*Primary Examiner* — Peter Bradford
(74) *Attorney, Agent, or Firm* — Akona IP PC

(57) ABSTRACT

One superconducting qubit device package disclosed herein includes a die having a first face and an opposing second face, and a package substrate having a first face and an opposing second face. The die includes a quantum device including a plurality of superconducting qubits and a plurality of resonators on the first face of the die, and a plurality of conductive pathways coupled between conductive contacts at the first face of the die and associated ones of the plurality of superconducting qubits or of the plurality of resonators. The second face of the package substrate also (Continued)

includes conductive contacts. The device package further includes first level interconnects disposed between the first face of the die and the second face of the package substrate, coupling the conductive contacts at the first face of the die with associated conductive contacts at the second face of the package substrate.

26 Claims, 12 Drawing Sheets

(51) Int. Cl.
    *G06N 10/00*     (2022.01)
    *H01L 39/02*     (2006.01)
    *H01L 39/22*     (2006.01)
    *H01L 39/24*     (2006.01)
    *H01L 25/00*     (2006.01)
    *H01L 23/48*     (2006.01)
    *H01L 23/00*     (2006.01)
    *H01L 27/18*     (2006.01)
    *B82Y 10/00*     (2011.01)
    *H01L 23/538*     (2006.01)
    *H01L 29/66*     (2006.01)

(52) U.S. Cl.
    CPC .............. *H01L 25/00* (2013.01); *H01L 27/18* (2013.01); *H01L 39/025* (2013.01); *H01L 39/223* (2013.01); *H01L 39/2493* (2013.01); *B82Y 10/00* (2013.01); *H01L 23/5383* (2013.01); *H01L 24/16* (2013.01); *H01L 29/66977* (2013.01); *H01L 2224/13109* (2013.01); *H01L 2224/16235* (2013.01); *H01L 2224/16238* (2013.01); *H01L 2924/15192* (2013.01); *H01L 2924/15311* (2013.01)

(58) Field of Classification Search
    CPC .............. H01L 39/223; H01L 39/2493; H01L 23/5383; H01L 24/16; H01L 29/66977; H01L 2224/13109; H01L 2224/16235; H01L 2224/16238; H01L 2924/15192; H01L 2924/15311; G06N 10/00; B82Y 10/00
    See application file for complete search history.

(56) References Cited

U.S. PATENT DOCUMENTS

| | | | |
|---|---|---|---|
| 2013/0264617 A1 | 10/2013 | Joshi et al. | |
| 2014/0246763 A1* | 9/2014 | Bunyk | H01L 24/05 438/2 |
| 2015/0179915 A1 | 6/2015 | Greer et al. | |
| 2016/0148112 A1 | 5/2016 | Kwon | |
| 2016/0190041 A1* | 6/2016 | Gong | H01L 23/544 257/774 |
| 2016/0364653 A1* | 12/2016 | Chow | H01L 39/223 |
| 2017/0193388 A1* | 7/2017 | Filipp | G06F 15/82 |
| 2017/0373044 A1* | 12/2017 | Das | H01L 25/50 |
| 2018/0013052 A1* | 1/2018 | Oliver | H01L 25/0652 |
| 2018/0102470 A1* | 4/2018 | Das | H01L 25/50 |
| 2019/0131511 A1 | 5/2019 | Clarke et al. | |
| 2019/0140073 A1 | 5/2019 | Pillarisetty et al. | |
| 2019/0148530 A1 | 5/2019 | Pillarisetty et al. | |
| 2019/0157393 A1 | 5/2019 | Roberts et al. | |
| 2019/0164077 A1 | 5/2019 | Roberts et al. | |
| 2019/0164959 A1 | 5/2019 | Thomas et al. | |
| 2019/0165152 A1 | 5/2019 | Roberts et al. | |
| 2019/0181256 A1 | 6/2019 | Roberts et al. | |
| 2019/0194016 A1 | 6/2019 | Roberts et al. | |
| 2019/0198618 A1 | 6/2019 | George et al. | |
| 2019/0206991 A1 | 7/2019 | Pillarisetty et al. | |
| 2019/0206992 A1 | 7/2019 | George et al. | |
| 2019/0206993 A1 | 7/2019 | Pillarisetty et al. | |
| 2019/0214385 A1 | 7/2019 | Roberts et al. | |
| 2019/0221659 A1 | 7/2019 | George et al. | |
| 2019/0229188 A1 | 7/2019 | Clarke et al. | |
| 2019/0229189 A1 | 7/2019 | Clarke et al. | |
| 2019/0252377 A1 | 8/2019 | Clarke et al. | |
| 2019/0259850 A1 | 8/2019 | Pillarisetty et al. | |
| 2019/0266511 A1 | 8/2019 | Pillarisetty et al. | |
| 2019/0267692 A1 | 8/2019 | Roberts et al. | |
| 2019/0288176 A1 | 9/2019 | Yoscovits et al. | |
| 2019/0296214 A1 | 9/2019 | Yoscovits et al. | |
| 2019/0305037 A1 | 10/2019 | Michalak et al. | |
| 2019/0305038 A1 | 10/2019 | Michalak et al. | |
| 2019/0312128 A1 | 10/2019 | Roberts et al. | |
| 2019/0334020 A1 | 10/2019 | Amin et al. | |
| 2019/0341459 A1 | 11/2019 | Pillarisetty et al. | |
| 2019/0363181 A1 | 11/2019 | Pillarisetty et al. | |
| 2019/0363239 A1 | 11/2019 | Yoscovits et al. | |

FOREIGN PATENT DOCUMENTS

| | | |
|---|---|---|
| WO | 2017213639 A1 | 12/2017 |
| WO | 2017213641 A1 | 12/2017 |
| WO | 2017213645 A1 | 12/2017 |
| WO | 2017213646 A1 | 12/2017 |
| WO | 2017213647 A1 | 12/2017 |
| WO | 2017213648 A1 | 12/2017 |
| WO | 2017213649 A1 | 12/2017 |
| WO | 2017213651 A1 | 12/2017 |
| WO | 2017213661 A1 | 12/2017 |
| WO | 2017217958 A1 | 12/2017 |
| WO | 2018030977 A1 | 2/2018 |
| WO | 2018044267 A1 | 3/2018 |
| WO | 2018057013 A1 | 3/2018 |
| WO | 2018057015 A1 | 3/2018 |
| WO | 2018057018 A1 | 3/2018 |
| WO | 2018057023 A1 | 3/2018 |
| WO | 2018057024 A1 | 3/2018 |
| WO | 2018057027 A1 | 3/2018 |
| WO | 2018063139 A1 | 4/2018 |
| WO | 2018063168 A1 | 4/2018 |
| WO | 2018063170 A1 | 4/2018 |
| WO | 2018063202 A1 | 4/2018 |
| WO | 2018063203 A1 | 4/2018 |
| WO | 2018063205 A1 | 4/2018 |
| WO | 2018106215 A1 | 6/2018 |
| WO | 2018118098 A1 | 6/2018 |
| WO | 2018125026 A1 | 7/2018 |

OTHER PUBLICATIONS

PCT/US2017/051950, Sep. 18, 2017, Substrate Engineering for Qubits.
PCT—Sep. 26, 2017 International Search Report and Written Opinion from International Application No. PCT/US2016/068629; 12 pages.
"Independent, extensible control of same-frequency superconducting qubits by selective broadcasting," Asaad et al., Netherlands Organisation for Applied Scientific Research, Aug. 28, 2015, 17 pages.
"Multilayer microwave integrated quantum circuits for scalable quantum computing," Brecht et al, Department of Applied Physics, Yale University, Sep. 4, 2015, 5 pages.
"Reducing intrinsic loss in superconducting resonators by surface treatment and deep etching of silicon substrates," Bruno, et al., QuTech Advanced Research Center and Kavli Institute of Nanoscience, Delft University of Technology, The Netherlands, Feb. 16, 2015, 9 pages.
"Surface loss simulations of superconducting coplanar waveguide resonators," Wenner et al, Applied Physics Letters 99, 113513 (2011), pp. 113513-1 through 3.
"Magnetic field tuning of coplanar waveguide resonators," Healey, et al., Applied Physics Letters 93, 043513 (2008), pp. 043513-1 through 3 (4 pages with cover sheet).
"Embracing the quantum limit in silicon computing," Morton et al, Macmillan Publishers, Nov. 17, 2011, vol. 479, Nature, pp. 345-353.

(56) References Cited

OTHER PUBLICATIONS

"Scalable quantum circuit and control for a superconducting surface code," Versluis et al, Netherlands Organisation for Applied Scientific Research, Dec. 28, 2016, 9 pages.

"Suspending superconducting qubits by silicon micromachining," Chu et al., Department of Applied Physics, Yale University, Jun. 10, 2016, 10 pages.

* cited by examiner

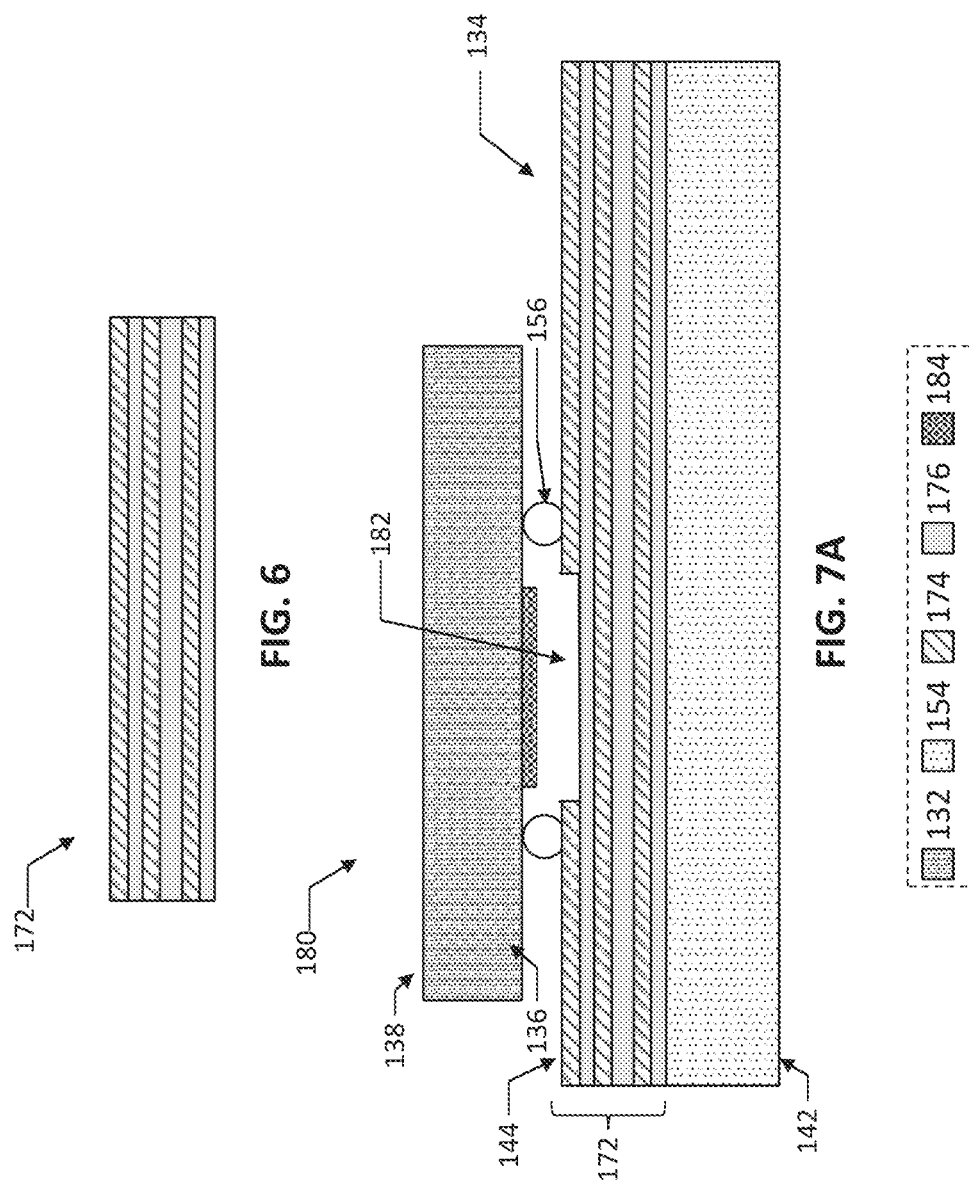

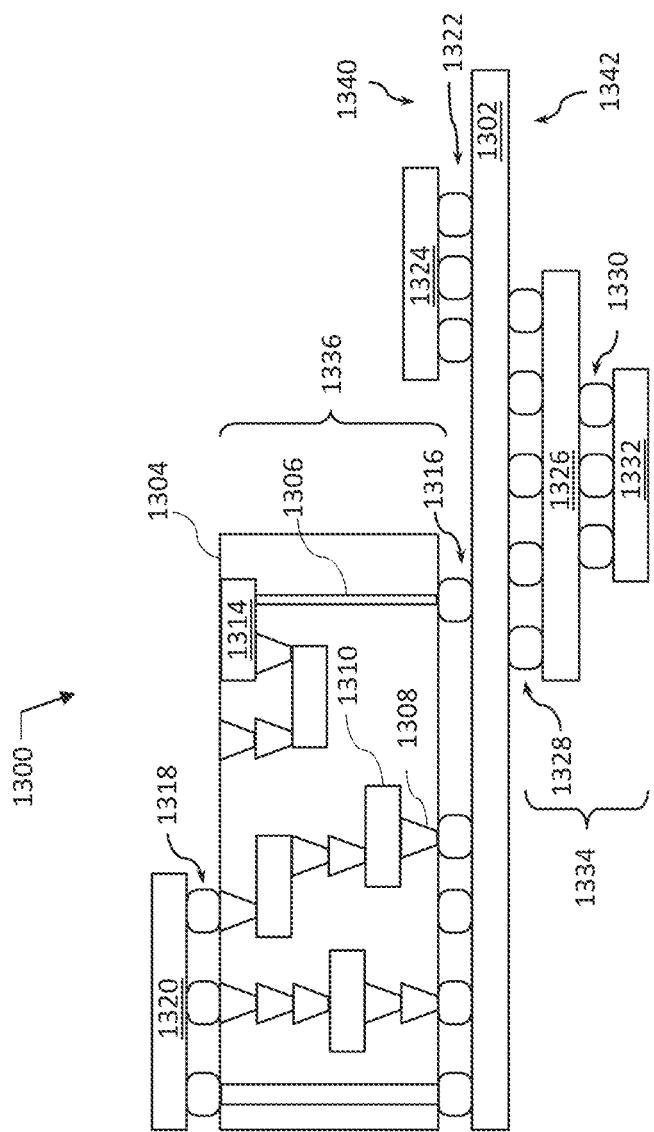

SUPERCONDUCTING QUBIT DEVICE PACKAGES

This application is a national stage application under 35 U.S.C. § 371 of PCT International Application Serial No. PCT/US2016/068629, filed Dec. 27, 2016, titled "SUPERCONDUCTING QUBIT DEVICE PACKAGES." The disclosure of this application is considered part of (and is incorporated by reference in) the disclosure of this application.

BACKGROUND

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 6 provides a schematic illustration of an exemplary metallization stack of a package substrate, according to some embodiments of the present disclosure.

FIG. 7A provides a schematic illustration of an exemplary superconducting qubit device package including voided dielectric layer(s) in a metallization stack of a package substrate when coupling to a die with a superconducting qubit device, according to some embodiments of the present disclosure.

FIG. 10 is a cross-sectional side view of a device assembly that may include any of the superconducting qubit device packages disclosed herein.

DETAILED DESCRIPTION

Overview

Figure 1:
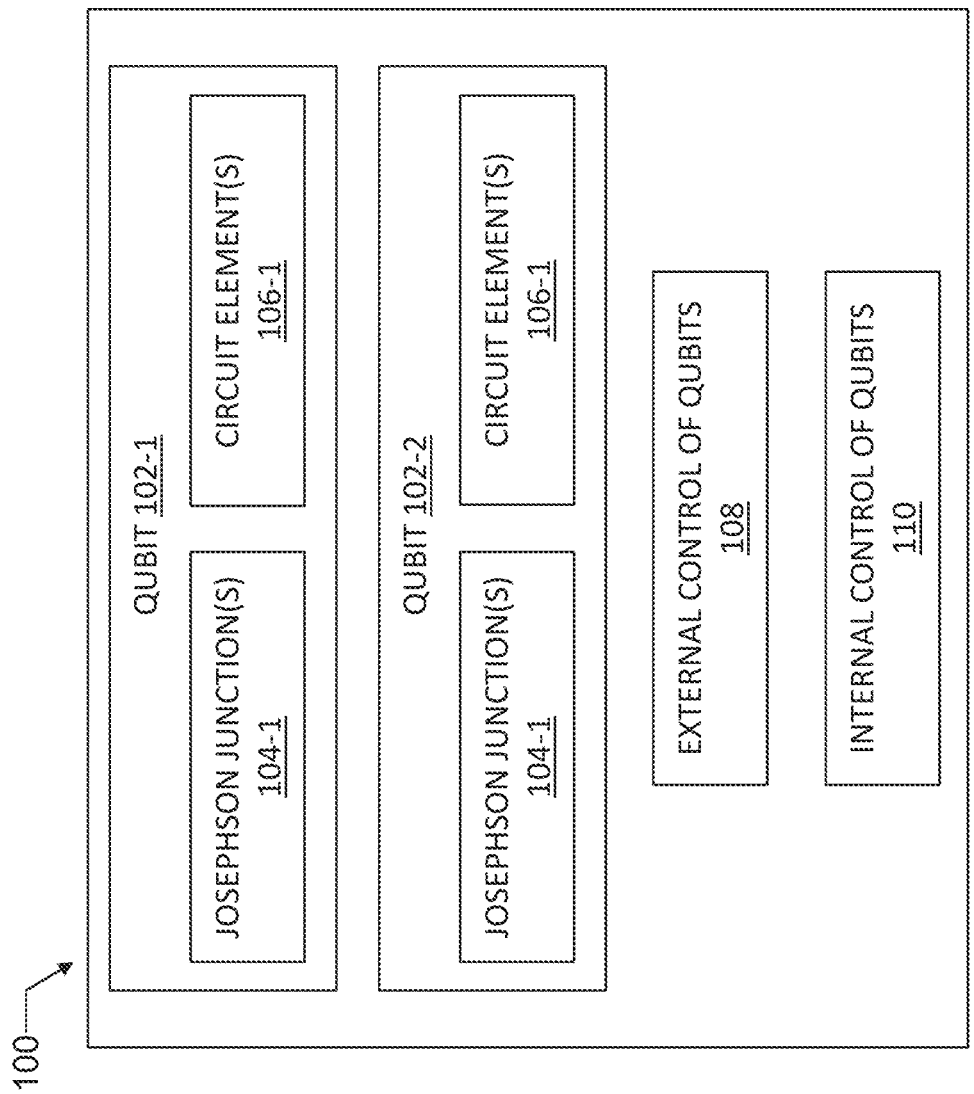
FIG. 1 provides a schematic illustration of an exemplary device implementing superconducting qubits, according to some embodiments of the present disclosure.

Disclosed herein are superconducting qubit device packages, as well as related computing devices and methods. For example, in some embodiments, a superconducting qubit device package may include a die having a first face and an opposing second face, and a package substrate having a first face and an opposing second face. The die may include a quantum device including a plurality of superconducting qubits disposed on the first face of the die, a plurality of resonators disposed on the first face of the die, and a plurality of conductive pathways coupled between conductive contacts at the first face of the die and associated ones of the plurality of superconducting qubits or associated ones of the plurality of resonators. Conductive contacts may be disposed at the second face of the package substrate. The device package may further include first level interconnects disposed between the first face of the die and the second face of the package substrate, coupling the conductive contacts at the first face of the die with associated conductive contacts at the second face of the package substrate.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art. For example, as used herein, a "high-k dielectric" refers to a material having a higher dielectric constant than silicon oxide. The terms "substantially," "close," "approximately," "near," and "about," generally refer to being within +/−20% of a target value based on the context of a particular value as described herein or as known in the art. The terms "oxide," "carbide," "nitride," etc. refer to compounds containing, respectively, oxygen, carbon, nitrogen, etc. As used herein, a "high-k dielectric" refers to a material having a higher dielectric constant than silicon oxide. As used herein, terms indicating what may be considered an idealized behavior, such as e.g. "superconducting" or "lossless", are intended to cover functionality that may not be exactly ideal but is within acceptable margins for a given application. For example, a certain level of loss, either in terms of non-zero electrical resistance or non-zero amount of spurious two-level systems (TLS's) may be acceptable such that the resulting materials and structures may still be referred to by these "idealized" terms. Specific values associated with an acceptable level of loss are expected to change over time as fabrication precision will improve and as fault-tolerant schemes may become more tolerant of higher losses, all of which are within the scope of the present disclosure.

Still further, while the present disclosure may include references to microwave signals, this is done only because current qubits are designed to work with such signals because the energy in the microwave range is higher than thermal excitations at the temperature that qubits are operated at. In addition, techniques for the control and measurement of microwaves are well known. For these reasons, typical frequencies of qubits are in 5-10 gigahertz (GHz) range, in order to be higher than thermal excitations, but low enough for ease of microwave engineering. However, advantageously, because excitation energy of qubits is controlled by the circuit elements, qubits can be designed to have any frequency. Therefore, in general, qubits could be designed to operate with signals in other ranges of electromagnetic spectrum and embodiments of the present disclosure could be modified accordingly. All of these alternative implementations are within the scope of the present disclosure.

Quantum Computing and Superconducting Qubits

As previously described herein, quantum computing, or quantum information processing, refers to the field of research related to computation systems that use quantum-mechanical phenomena to manipulate data. One example of quantum-mechanical phenomena is the principle of quantum superposition, which asserts that any two or more quantum states can be added together, i.e. superposed, to produce another valid quantum state, and that any quantum state can be represented as a sum of two or more other distinct states. Quantum entanglement is another example of quantum-mechanical phenomena. Entanglement refers to groups of particles being generated or interacting in such a way that the state of one particle becomes intertwined with that of the others. Furthermore, the quantum state of each particle cannot be described independently. Instead, the quantum state is given for the group of entangled particles as a whole. Yet another example of quantum-mechanical phenomena is sometimes described as a "collapse" because it asserts that when we observe (measure) particles, we unavoidably change their properties in that, once observed, the particles cease to be in a state of superposition or entanglement (i.e. by trying to ascertain anything about the particles, we collapse their state).

Put simply, superposition postulates that a given particle can be simultaneously in two states, entanglement postulates that two particles can be related in that they are able to instantly coordinate their states irrespective of the distance between them in space and time, and collapse postulates that when one observes a particle, one unavoidably changes the state of the particle and its' entanglement with other particles. These unique phenomena make manipulation of data in quantum computers significantly different from that of classical computers (i.e. computers that use phenomena of classical physics). Classical computers encode data into binary values, commonly referred to as bits. At any given time, a bit is always in only one of two states—it is either 0 or 1. Quantum computers use so-called quantum bits, referred to as qubits (both terms "bits" and "qubits" often interchangeably refer to the values that they hold as well as to the actual devices that store the values). Similar to a bit of a classical computer, at any given time, a qubit can be either 0 or 1. However, in contrast to a bit of a classical computer, a qubit can also be 0 and 1 at the same time, which is a result of superposition of quantum states. Entanglement also contributes to the unique nature of qubits in that input data to a quantum processor can be spread out among entangled qubits, allowing manipulation of that data to be spread out as well: providing input data to one qubit results in that data being shared to other qubits with which the first qubit is entangled.

Compared to well-established and thoroughly researched classical computers, quantum computing is still in its infancy, with the highest number of qubits in a solid-state quantum processor currently being about 10. One of the main challenges resides in protecting qubits from decoherence so that they can stay in their information-holding states long enough to perform the necessary calculations and read out the results.

As the foregoing illustrates, ability to manipulate and read out quantum states, making quantum-mechanical phenomena visible and traceable, and ability to deal with and improve on the fragility of quantum states of a qubit present unique challenges not found in classical computers. These challenges explain why so many current efforts of the industry and the academics continue to focus on a search for new and improved physical systems whose functionality could approach that expected of theoretically designed qubits. Physical systems for implementing qubits that have been explored until now include e.g. superconducting (SC) qubits, single trapped ion qubits, Silicon (Si) quantum dot qubits, photon polarization qubits, etc.

Out of the various physical implementations of qubits listed above, superconducting qubits are promising candidates for building a quantum computer.

All of superconducting qubits operate based on the Josephson effect, which refers to a macroscopic quantum phenomenon of supercurrent, i.e. a current that, due to zero electrical resistance, flows indefinitely long without any voltage applied, across a device known as a Josephson Junction. Josephson Junctions are integral building blocks in superconducting quantum circuits where they form the basis of quantum circuit elements that can approximate functionality of theoretically designed qubits.

Within superconducting qubit implementations, three classes are typically distinguished: charge qubits, flux qubits, and phase qubits. Transmons, a type of charge qubits with the name being an abbreviation of "transmission line shunted plasma oscillation qubits", are particularly encouraging because they exhibit reduced sensitivity to charge noise.

In implementations when superconducting qubits are implemented as transmon qubits, two basic elements of superconducting quantum circuits are inductors and capacitors. However, circuits made using only these two elements cannot make a system with two energy levels because, due to the even spacing between the system's energy levels, such circuits will produce harmonic oscillators with a ladder of equivalent states. A nonlinear element is needed to have an effective two-level quantum state system, or qubit. Josephson Junction is an example of such non-linear, non-dissipative circuit element.

Josephson Junctions may form the central circuit elements of a quantum computer based on superconducting qubits. A Josephson Junction includes two superconductors connected by a weak link. For example, a Josephson Junction may be implemented as a thin layer of an insulating material, referred to as a barrier or a tunnel barrier and serving as the "weak link" of the junction, sandwiched between two layers of superconductor. Josephson Junctions act as superconducting tunnel junctions. Cooper pairs tunnel across the barrier from one superconducting layer to the other. The electrical characteristics of this tunneling are governed by so-called Josephson relations which provide the basic equations governing the dynamics of the Josephson effect:

$$I = I_c \sin\varphi \quad (1)$$

$$V = \frac{\hbar}{2e}\dot\varphi \quad (2)$$

In these equations, $\varphi$ is the phase difference in the superconducting wave function across the junction, $I_c$ (the critical current) is the maximum current that can tunnel through the junction, which depends on the barrier thickness and the area of the junction, V is the voltage across the Josephson Junction, I is the current flowing through the Josephson Junction, $\hbar$ is the reduced Planck's constant, and e is electron's charge. Equations (1) and (2) can be combined to give an equation (3):

$$V = \frac{\hbar}{2eI_c\cos\varphi}\dot I \quad (3)$$

Equation (3) looks like the equation for an inductor with inductance L:

$$L = \frac{\hbar}{2eI_c\cos\varphi} \quad (4)$$

Since inductance is a function of $\varphi$, which itself is a function of I, the inductance of a Josephson Junction is non-linear, which makes an LC circuit formed using a Josephson Junction as the inductor have uneven spacing between its energy states.

The foregoing provides an illustration of using a Josephson Junction in a transmon, which is one class of superconducting qubit. In other classes of superconducting qubits, Josephson Junctions combined with other circuit elements have similar functionality of providing the non-linearity necessary for forming an effective two-level quantum state, or qubit. In other words, when implemented in combination with other circuit elements (e.g. capacitors in transmons or superconducting loops in flux qubits), one or more Josephson Junctions allow realizing a quantum circuit element which has uneven spacing between its energy levels resulting in a unique ground and excited state system for the qubit. This is illustrated in FIG. 1, providing a schematic illustration of a superconducting quantum circuit 100, according to some embodiments of the present disclosure. As shown in FIG. 1, an exemplary superconducting quantum circuit 100 includes two or more qubits: 102-1 and 102-2. Qubits 102-1 and 102-2 may be identical and thus the discussion of FIG. 1 refers generally to the "qubit 102," and the same applies to referring to Josephson Junctions 104-1 and 104-2 generally as "Josephson Junctions 104" and referring to circuit elements 106-1 and 106-2 generally as "circuit elements 106." As shown in FIG. 1, each of the superconducting qubits 102 may include one or more Josephson Junctions 104 connected to one or more other circuit elements 106, which, in combination with the Josephson Junction(s) 104, form a non-linear circuit providing a unique two-level quantum state for the qubit. The circuit elements 106 could be e.g. capacitors in transmons or superconducting loops in flux qubits.

As also shown in FIG. 1, an exemplary superconducting quantum circuit 100 typically includes means 108 for providing external control of qubits 102 and means 110 for providing internal control of qubits 102. In this context, "external control" refers to controlling the qubits 102 from outside of, e.g., an integrated circuit (IC) chip comprising the qubits, including control by a user of a quantum computer, while "internal control" refers to controlling the qubits 102 within the IC chip. For example, if qubits 102 are transmon qubits, external control may be implemented by means of flux bias lines (also known as "flux lines" and "flux coil lines") and by means of readout and drive lines (also known as "microwave lines" since qubits are typically designed to operate with microwave signals), described in greater detail below. On the other hand, internal control lines for such qubits may be implemented by means of resonators, e.g., coupling and readout resonators, also described in greater detail below.

Any one of the qubits 102, the external control means 108, and the external control means 110 of the quantum circuit 100 may be provided on, over, or at least partially embedded in a substrate (not shown in FIG. 1).

Figure 2:
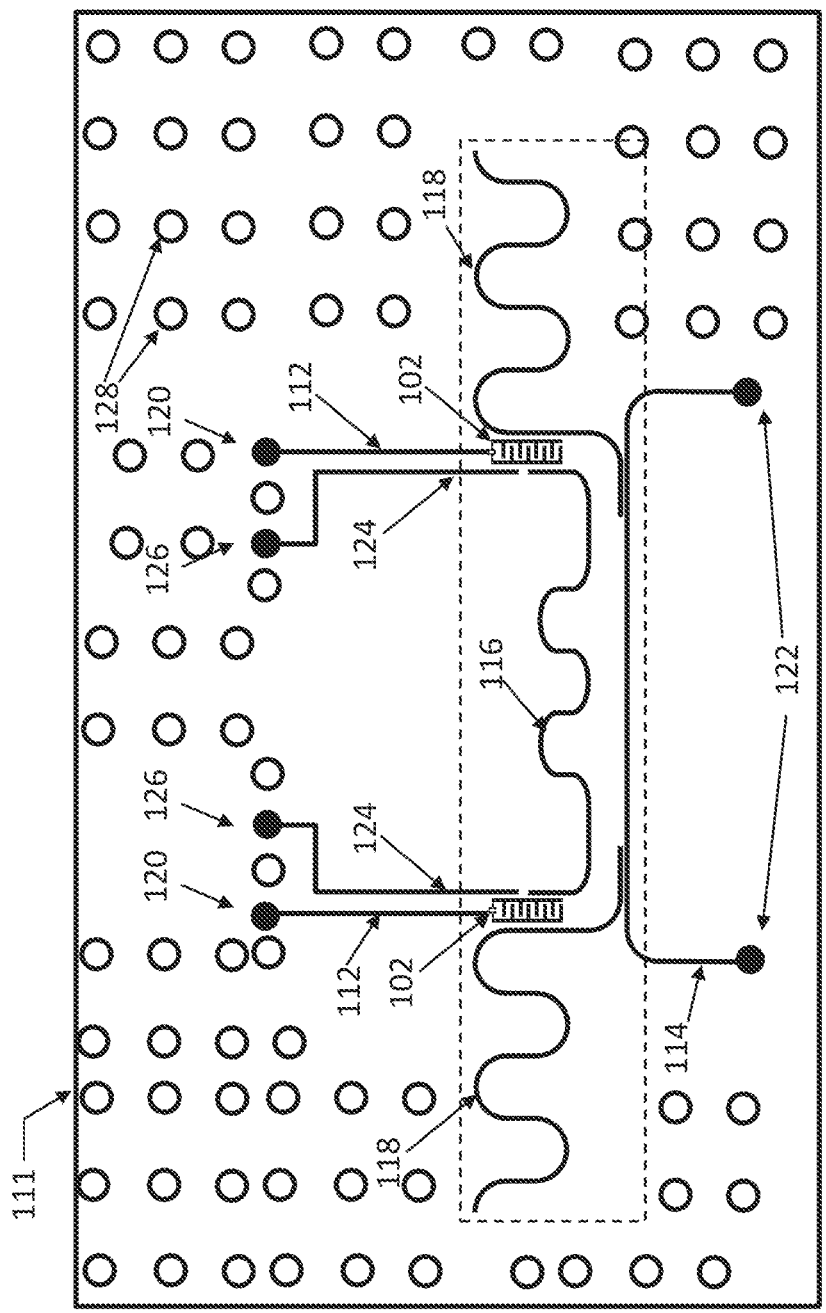
FIG. 2 provides a schematic illustration of an exemplary physical layout of a device implementing superconducting qubits, according to some embodiments of the present disclosure.

FIG. 2 provides a schematic illustration of an exemplary physical layout 111 of a superconducting quantum circuit where qubits are implemented as transmons, according to some embodiments of the present disclosure.

Similar to FIG. 1, FIG. 2 illustrates two qubits 102. In addition, FIG. 2 illustrates flux bias lines 112, microwave lines 114, a coupling resonator 116, a readout resonator 118, and conductive contacts 120 and 122. The flux bias lines 112 and the microwave lines 114 may be viewed as examples of the external control means 108 shown in FIG. 1. The coupling resonator 116 and the readout resonator 118 may be viewed as examples of the internal control means 110 shown in FIG. 1.

Running a current through the flux bias lines 112, provided from the conductive contacts 120, allows tuning (i.e. changing) the frequency of the corresponding qubits 102 to which each line 112 is connected. In general, it operates in the following manner. As a result of running the current in a particular flux bias line 112, magnetic field is created around the line. If such a magnetic field is in sufficient proximity to the qubit 102, e.g. by a portion of the flux bias line 112 being provided next to the qubit 102, the magnetic field couples to the qubit, thereby changing the spacing between the energy levels of the qubit. This, in turn, changes the frequency of the qubit since the frequency is directly related to the spacing between the energy levels via Planck's equation. The Planck's equation is E=hv, where E is the energy (in this case the energy difference between energy levels of a qubit), h is the Planck's constant and v is the frequency (in this case the frequency of the qubit). As this equation illustrates, if E changes, then v changes. Provided there is sufficient multiplexing, different currents can be sent down each of the flux lines allowing for independent tuning of the various qubits.

Typically, the qubit frequency may be controlled in order to bring the frequency either closer to or further away from another resonant item, for example a coupling resonator such as 116 shown in FIG. 2 that connects two or more qubits together, as may be desired in a particular setting.

For example, if it is desirable that a first qubit 102 (e.g. the qubit 102 shown on the left side of FIG. 2) and a second qubit 102 (e.g. the qubit 102 shown on the right side of FIG. 2) interact, via the coupling resonator 116 connecting these qubits, then both qubits 102 may need to be tuned to be at nearly the same frequency. One way in which such two qubits could interact is that, if the frequency of the first qubit 102 is tuned very close to the resonant frequency of the coupling resonator 116, the first qubit can, when in the excited state, relax back down to the ground state by emitting a photon (similar to how an excited atom would relax) that would resonate within the coupling resonator 116. If the second qubit 102 is also at this energy (i.e. if the frequency of the second qubit is also tuned very close to the resonant frequency of the coupling resonator 116), then it can absorb the photon emitted from the first qubit, via the coupling resonator 116, and be excited from its ground state to an excited state. Thus, the two qubits interact in that a state of one qubit is controlled by the state of another qubit. In other scenarios, two qubits could interact via a coupling resonator at specific frequencies, but these three elements do not have to be tuned to be at nearly the same frequency with one another. In general, two or more qubits could be configured to interact with one another by tuning their frequencies to specific values or ranges.

On the other hand, it may sometimes be desirable that two qubits coupled by a coupling resonator do not interact, i.e. the qubits are independent. In this case, by applying magnetic flux, by means of controlling the current in the appropriate flux bias line, to one qubit it is possible to cause the frequency of the qubit to change enough so that the photon it could emit no longer has the right frequency to resonate on the coupling resonator. If there is nowhere for such a frequency-detuned photon to go, the qubit will be better isolated from its surroundings and will live longer in its current state. Thus, in general, two or more qubits could be configured to avoid or eliminate interactions with one another by tuning their frequencies to specific values or ranges.

The state(s) of each qubit 102 may be read by way of its corresponding readout resonator 118. As explained below, the qubit 102 induces a resonant frequency in the readout resonator 118. This resonant frequency is then passed to the microwave lines 114 and communicated to the pads 122.

To that end, a readout resonator 118 may be provided for each qubit. The readout resonator 118 may be a transmission line that includes a capacitive connection to ground on one side and is either shorted to the ground on the other side (for a quarter wavelength resonator) or has a capacitive connection to ground (for a half wavelength resonator), which results in oscillations within the transmission line (resonance), with the resonant frequency of the oscillations being close to the frequency of the qubit. The readout resonator 118 is coupled to the qubit by being in sufficient proximity to the qubit 102, more specifically in sufficient proximity to the capacitor of the qubit 102, when the qubit is implemented as a transmon, either through capacitive or inductive coupling. Due to a coupling between the readout resonator 118 and the qubit 102, changes in the state of the qubit 102 result in changes of the resonant frequency of the readout resonator 118. In turn, because the readout resonator 118 is in sufficient proximity to the microwave line 114, changes in the resonant frequency of the readout resonator 118 induce changes in the current in the microwave line 114, and that current can be read externally via the wire bonding pads 122.

The coupling resonator 116 allows coupling different qubits together, e.g. as described above, in order to realize quantum logic gates. The coupling resonator 116 is similar to the readout resonator 118 in that it is a transmission line that includes capacitive connections to ground on both sides (i.e. a half wavelength resonator), which also results in oscillations within the coupling resonator 116. Each side of the coupling resonator 116 is coupled (again, either capacitively or inductively) to a respective qubit by being in sufficient proximity to the qubit, namely in sufficient proximity to the capacitor of the qubit, when the qubit is implemented as a transmon. Because each side of the coupling resonator 116 has coupling with a respective different qubit, the two qubits are coupled together through the coupling resonator 116. In this manner, state of one qubit depends on the state of the other qubit, and the other way around. Thus, coupling resonators may be employed in order to use a state of one qubit to control a state of another qubit.

In some implementations, the microwave line 114 may be used to not only readout the state of the qubits as described above, but also to control the state of the qubits. When a single microwave line is used for this purpose, the line operates in a half-duplex mode where, at some times, it is configured to readout the state of the qubits, and, at other times, it is configured to control the state of the qubits. In other implementations, microwave lines such as the line 114 shown in FIG. 2 may be used to only readout the state of the qubits as described above, while separate drive lines such as e.g. drive lines 124 shown in FIG. 2, may be used to control the state of the qubits. In such implementations, the microwave lines used for readout may be referred to as readout lines (e.g. readout line 114), while microwave lines used for controlling the state of the qubits may be referred to as drive lines (e.g. drive lines 124). The drive lines 124 may control the state of their respective qubits 102 by providing, using e.g. conductive contacts 126 as shown in FIG. 2, a microwave pulse at the qubit frequency, which in turn stimulates (i.e. triggers) a transition between the states of the qubit. By varying the length of this pulse, a partial transition can be stimulated, giving a superposition of the states of the qubit.

Flux bias lines, microwave lines, coupling resonators, drive lines, and readout resonators, such as e.g. those described above, together form interconnects for supporting propagation of microwave signals. Further, any other connections for providing direct electrical interconnection between different quantum circuit elements and components, such as e.g. connections from electrodes of Josephson Junctions to plates of the capacitors or to superconducting loops of superconducting quantum interference devices (SQUIDS) or connections between two ground lines of a particular transmission line for equalizing electrostatic potential on the two ground lines, are also referred to herein as interconnects. Still further, the term "interconnect" may also be used to refer to elements providing electrical interconnections between quantum circuit elements and components and non-quantum circuit elements, which may also be provided in a quantum circuit, as well as to electrical interconnections between various non-quantum circuit elements provided in a quantum circuit. Examples of non-quantum circuit elements which may be provided in a quantum circuit may include various analog and/or digital systems, e.g. analog to digital converters, mixers, multiplexers, amplifiers, etc.

Coupling resonators and readout resonators may be configured for capacitive coupling to other circuit elements at one or both ends in order to have resonant oscillations, whereas flux bias lines and microwave lines may be similar to conventional microwave transmission lines because there is no resonance in these lines. Each one of these interconnects may be implemented as any suitable architecture of a microwave transmission line, such as e.g. a coplanar waveguide, a stripline, a microstrip line, or an inverted microstrip line. Typical materials to make the interconnects include aluminum (Al), niobium (Nb), niobium nitride (NbN), titanium nitride (TiN), molybdenum rhenium (MoRe), and niobium titanium nitride (NbTiN), all of which are particular types of superconductors. However, in various embodiments, other suitable superconductors and alloys of superconductors may be used as well.

In various embodiments, the interconnects as shown in FIG. 2 could have different shapes and layouts. For example, some interconnects may comprise more curves and turns while other interconnects may comprise less curves and turns, and some interconnects may comprise substantially straight lines. In some embodiments, various interconnects may intersect one another, in such a manner that they don't make an electrical connection, which can be done by using e.g. a bridge, bridging one interconnect over the other. As long as these interconnects operate in accordance with use of these interconnects as known in the art for which some exemplary principles were described above, quantum circuits with different shapes and layouts of the interconnects than those illustrated in FIG. 2 are all within the scope of the present disclosure.

In addition, FIG. 2 further illustrates ground conductive contacts (i.e. contacts connecting to the ground plane) 128. As is known in the art, such ground contacts are typically used when a die supports propagation of microwave signals in order to e.g. suppress microwave parallel plate modes, cross-coupling between circuital blocks, and substrate resonant modes. In general, providing ground pathways may improve signal quality, enable fast pulse excitation and improve the isolation between the different lines.

Only two ground contacts are labeled in FIG. 2 with the reference numeral 128, but all white circle shown throughout the die housing the quantum circuit 111 are intended to illustrate exemplary locations of ground conductive contacts, e.g. conductive bumps, to be connected to the interposer substrate. The illustration of the location and the number of the ground contacts 128 in FIG. 2 is purely illustrative and, in various embodiments, ground contacts 128 may be provided at different places, as known in microwave engineering. The signals conductive contacts 120, 122, 126, and 128 are used for programming, tuning and readout of the qubits. The die on which these conductive contacts and the rest of the quantum circuit are provided may consist of multiple conductive layers that may be electrically isolated from each other by an insulating material, which could include any suitable material, such as an interlayer dielectric (ILD). Examples of insulating materials may include silicon oxide, silicon nitride, aluminum oxide, carbon-doped oxide, and/or silicon oxynitride.

While FIGS. 1 and 2 illustrate examples of quantum circuits comprising only two qubits 102, embodiments with any larger number of qubits are possible and are within the scope of the present disclosure. Furthermore, while FIGS. 1 and 2 illustrate embodiments specific to transmons, subject matter disclosed herein is not limited in this regard and may include other embodiments of quantum circuits implementing other types of superconducting qubits, all of which are within the scope of the present disclosure.

Flip-Chip Packaging Assembly for Superconducting Qubits

Figure 3:
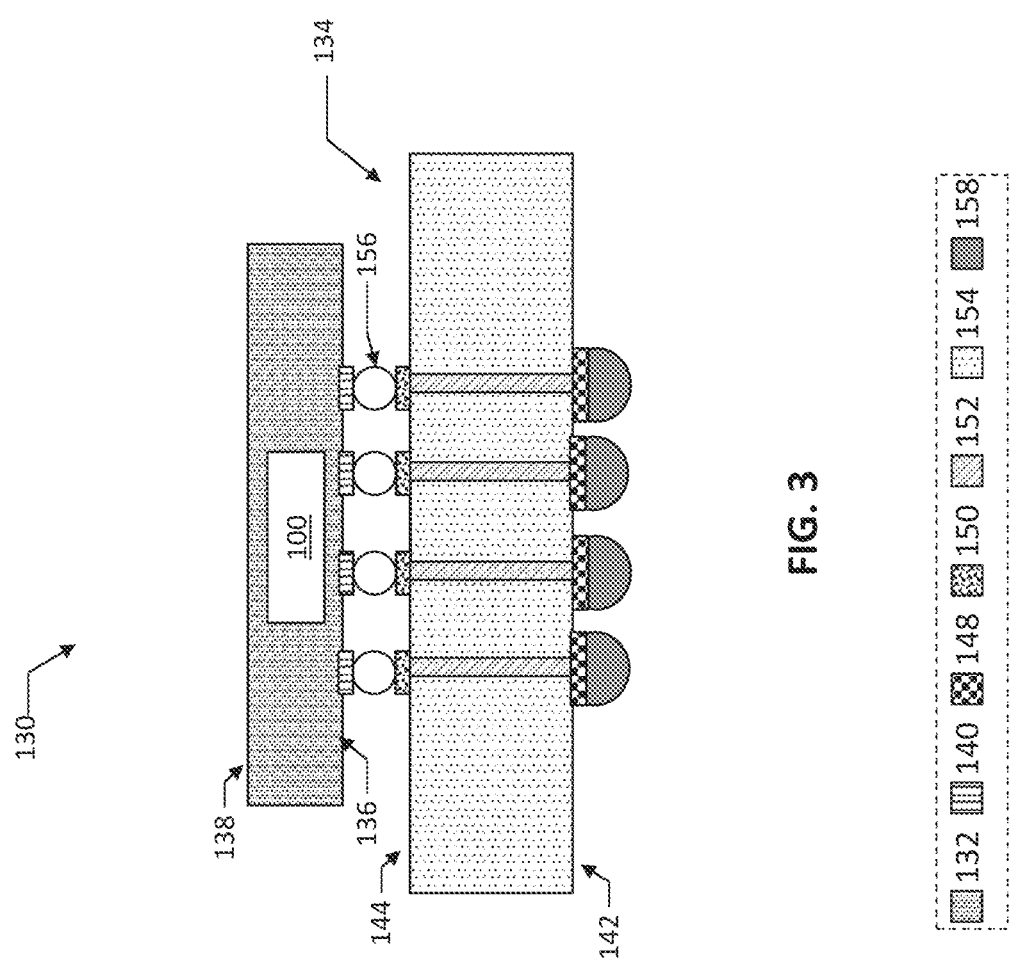
FIG. 3 provides a schematic illustration of an exemplary superconducting qubit device package coupling a die with a superconducting qubit device to a package substrate, according to some embodiments of the present disclosure.

In some embodiments, the quantum circuit 100, e.g. as illustrated with the physical layout 111, may be included in a die and coupled to a package substrate to form a SC qubit device package. For example, FIG. 3 illustrates a SC qubit device package 130 in which a SC quantum circuit 100 is included in a die 132, and the die 132 is coupled to a package substrate 134. The particular SC quantum circuit 100 illustrated in FIG. 3 may be implemented with the physical layout 111 illustrated in FIG. 2, but any of the SC quantum circuits 100 disclosed herein may be included in a die (e.g., the die 132), and coupled to a package substrate (e.g., the package substrate 134). In particular, any number of qubits 102, flux bias lines 112, microwave lines 114, coupling resonators 116, readout resonators 118, drive lines 124, conductive contacts 120, 122, 126, and 128, and other components discussed herein with reference to the SC quantum circuit 100 may be included in the die 132.

A number of elements referred in the description of FIG. 3 with reference numerals are indicated in FIG. 3 with different patterns, with a legend showing the correspondence between the reference numerals and patterns being provided at the bottom of FIG. 3, and are not labeled in FIG. 3 with arrows pointing to them in order to not clutter the drawing. For example, the legend illustrates that FIG. 3 uses different patterns to show the die 132, the conductive contacts 140, 148, and 150, etc.

The die 132 may include a first face 136 and an opposing second face 138. The qubits 102 and the resonators 116/118 may be proximate to or provided on the first face 136, and conductive pathways may extend and be coupled between these elements and the conductive contacts 120, 122, 126, and 128, also disposed at the first face 136. A plurality of the conductive contacts 120, 122, 126, and 128 disposed at the first face 136 of the SC qubit die 132 are shown in FIG. 3 as conductive contacts 140. The conductive pathways are not specifically shown in FIG. 3 because the details of the SC quantum circuit 100 are not specifically shown in FIG. 3, but could be in the form of e.g. one or more of flux bias lines 112, microwave lines 114, and drive lines 124, and may be implemented as conductive vias, conductive lines, and/or any combination of conductive vias and lines. In some embodiments, such conductive pathways are also disposed on the first face 136 of the die 132. In various embodiments, the conductive contacts 140 may be formed of any suitable conductive material (e.g., a superconducting material). The conductive contacts 140 may take form of solder bond pads, but other first level interconnect structures may be used (e.g., conductive epoxies, anisotropic conductive films, copper to copper bonding posts, etc.) to route electrical signals to/from the die 132, as discussed below.

The package substrate 134 may include a first face 142 and an opposing second face 144. Conductive contacts 148 may be disposed at the first face 142, and conductive contacts 150 may be disposed at the second face 144. Conductive pathways 152 may extend through an insulating material 154 of the package substrate 134 between the first face 142 and the second face 144 of the package substrate 134, electrically coupling various ones of the conductive contacts 148 to various ones of the conductive contacts 150, in any desired manner. The insulating material 154 may be a dielectric material (e.g., an ILD), and may take the form of any of the embodiments of the insulating materials disclosed herein, for example. The conductive pathways 152 may include one or more conductive vias, one or more conductive lines, or a combination of conductive vias and conductive lines, for example.

In some embodiments, the package substrate 134 may be or may otherwise include a silicon interposer, and the conductive pathways 152 may be through-silicon vias. Silicon may have a desirably low coefficient of thermal expansion compared with other dielectric materials that may be used for the insulating material 154, and thus may limit the degree to which the package substrate 134 expands and contracts during temperature changes relative to such other materials (e.g., polymers having higher coefficients of thermal expansion). A silicon interposer may also help the package substrate 134 achieve a desirably small line width and maintain high connection density to the die 132.

Limiting differential expansion and contraction may help preserve the mechanical and electrical integrity of the SC qubit device package 130 as the SC qubit device package 130 is fabricated (and exposed to higher temperatures) and used in a cooled environment (and exposed to lower, e.g. cryogenic, temperatures). In some embodiments, thermal expansion and contraction in the package substrate 134 may be managed by maintaining an approximately uniform density of the conductive material in the package substrate 134 (so that different portions of the package substrate 134 expand and contract uniformly), using reinforced dielectric materials as the insulating material 154 (e.g., dielectric materials with silicon dioxide fillers), or utilizing stiffer materials as the insulating material 154 (e.g., a prepreg material including glass cloth fibers).

In some embodiments, the insulating material 154 of the package substrate 134 is selected to be the same as the insulating material of the SC qubit die 132. In one implementation, the die 132 and the package substrate 134 may be a crystalline substrate such as, but not limited to a silicon or a sapphire substrate, and may be provided as a wafer or a portion thereof. In other implementations, the substrate may be non-crystalline. In general, any material that provides sufficient advantages (e.g. sufficiently good electrical isolation and/or ability to apply known fabrication and processing techniques) to outweigh the possible disadvantages (e.g. negative effects of various defects), and that may serve as a foundation upon which a quantum circuit may be built, falls within the spirit and scope of the present disclosure. Additional examples of substrates include silicon-on-insulator (SOI) substrates, III-V substrates, and quartz substrates.

Selecting the substrate for the SC qubit die 132 and the package substrate 134 to be of the same material provides a number of advantages. One advantage is that it ensures that thermal coefficients of expansion/contraction are the same or substantially the same for these two substrates, which, in turn allows very small pitch interconnects, higher mechanical reliability due to less stress on the interconnects, and simpler design for manufacturing (since differences in thermal expansion during high temperature assembly are reduced). In addition, reduced stresses on the superconducting films in the die can help improve the electrical performance and lifetime of the device. Furthermore, since the electromagnetic fields from the resonators may extend a non-negligible distance from the surface of the die, the package material needs to be extremely low loss or/and the package substrate needs to be provided sufficiently far away from the die to reduce the negative effects of these fields on the quality factor of the resonators and, thus, on the coherence times of the SC qubits. Ensuring that the package material is very low loss and providing a large spacing between the package substrate are both challenging. However, using the same material for the SC qubit die 132 and the package substrate 134 eliminates or at least reduces the demand of providing a large spacing between the package substrate and the SC qubit die surface while still allowing to provide high quality factor resonators. Reducing the demand for the spacing between the package substrate and the SC qubit die in turn allows fine pitch, high density interconnects. As the foregoing illustrates, selecting the substrate for the SC qubit die 132 and the package substrate 134 to be of the same material is one of the special measures proposed herein which may be particular advantageous for quantum circuits but which did not have such particular advantages for classical (i.e. non-quantum) circuits.

The conductive contacts 140 of the die 132 may be electrically coupled to the conductive contacts 150 of the package substrate 134 via first level interconnects 156, shown in FIG. 3 as white circles associated with the conductive contacts 150. In some embodiments, the first level interconnects 156 may include solder bumps or balls (as illustrated in FIG. 3 and some subsequent FIGS); for example, the first level interconnects 156 may be flip chip (or controlled collapse chip connection, C4) bumps disposed initially on the die 132 or on the package substrate 134. Second level interconnects 158 (e.g., solder balls or other types of interconnects) may couple the conductive contacts 148 on the first face 142 of the package substrate 134 to another component, such as a circuit board (not specifically shown in FIG. 3). Examples of arrangements of electronics packages that may include an embodiment of the SC qubit device package 130 are discussed below with reference to FIG. 10. The die 132 may be brought in contact with the package substrate 134 using a pick-and-place apparatus, for example, and a reflow or thermal compression bonding operation may be used to couple the die 132 to the package substrate 134 via the first level interconnects 156.

Having first level interconnects 156 disposed between the first face 136 of the die 132 and the second face 144 of the package substrate 134 (e.g., using solder bumps as part of flip chip packaging techniques) may enable the SC qubit device package 130 to achieve a smaller footprint and higher die-to-package-substrate connection density than could be achieved using conventional wirebond techniques (in which conductive contacts between the die 132 and the package substrate 134 are constrained to be located on the periphery of the die 132). For example, a die 132 having a square first face 136 with side length N may be able to form 4N wirebond interconnects to the package substrate 134, versus $N^2$ flip chip interconnects (utilizing the entire "full field" surface area of the first face 136). Additionally, in some applications, wirebond interconnects may generate unacceptable amounts of heat that may damage or otherwise interfere with the performance of the SC quantum circuit 100. Using solder bumps as the first level interconnects 156 may enable the SC qubit device package 130 to have much lower parasitic inductance relative to using wirebonds to couple the die 132 and the package substrate 134, which may result in an improvement in signal integrity for high speed signals communicated between the die 132 and the package substrate 134.

In some embodiments, the surface of the die around the contacts 140 may be coated with a material which is not wetted by the solder material 156. This material is generally known as a solder mask and can take any appropriate form, such as silicon nitride, aluminum oxide, and silicon oxide. The presence of this solder mask material enables solder mask defined contacts.

A solder resist material may be disposed around the conductive contacts 148 (not specifically shown in FIG. 3). The solder resist material may be a polyimide or similar material, or may be any appropriate type of packaging solder resist material. In some embodiments, the solder resist material may be a liquid or dry film material including photoimageable polymers. In some embodiments, the solder resist material may be non-photoimageable.

While such a solder resist material would also typically be provided in packages employing non-quantum circuits around conductive contacts such as the contacts 140 and 150, because in the device package 130 these conductive contacts are in close proximity to the elements of the SC quantum circuit 100, preferably the conductive contacts 140 and 150 are not surrounded by the solder resist material because such a material is likely to be lossy in terms of spurious (i.e. undesirable) two-level systems (TLSs) and would be detrimental to the operation of the qubits 102 because it would lead to qubit decoherence. Not providing solder resist material around conductive contacts in the vicinity of the elements of the SC quantum circuit 100, in particular in the vicinity of the resonators 116 and 118 described herein, is another of the special measures described herein which may be particular advantageous for quantum circuits but which did not have such particular advantages for classical (i.e. non-quantum) circuits.

In various embodiments, more or fewer structures may be included in the conductive pathways and conductive contacts described with reference to FIG. 3. In some embodiments, conductive lines of the die 132 and the package substrate 134 may extend into and out of the plane of the drawing, providing conductive pathways to route electrical signals to and/or from various elements in the die 132.

The conductive vias and/or lines that provide the conductive pathways in/on the die 132 or/and in/on the package substrate 134 (e.g. conductive pathways 152) may be formed using any suitable techniques. Examples of such techniques may include subtractive fabrication techniques, additive or semi-additive fabrication techniques, single Damascene fabrication techniques, dual Damascene fabrication techniques, or any other suitable technique. In some embodiments, layers of insulator material, such as e.g. oxide material or nitride material, may insulate various structures in the conductive pathways from proximate structures, and/or may serve as etch stops during fabrication. In some embodiments, additional layers, such as e.g. diffusion barrier layers or/and adhesion layers may be disposed between conductive material and proximate insulating material. Diffusion barrier layers may reduce diffusion of the conductive material into the insulating material. Adhesion layers may improve mechanical adhesion between the conductive material and the insulating material.

As noted above, interconnect structures may be arranged within the SC quantum circuit 100 and in the package substrate 134 to route electrical signals according to a wide variety of designs (in particular, the arrangement is not limited to the particular configuration of interconnect structures depicted in FIG. 3 or any of the other accompanying figures, and may include more or fewer interconnect structures). During operation of the SC quantum circuit 100, electrical signals (such as e.g. power, input/output (I/O) signals, including various control signals for external and internal control of the qubits 102) may be routed to and/or from the qubits 102 of the SC quantum circuit 100 through the interconnects provided by the conductive contacts and conductive pathways of the die 132 and the package substrate 134.

Example superconducting materials that may be used for the structures in the conductive pathways and/or conductive contacts of the die 132 and/or the package substrate 134, may include aluminum, niobium, tin, titanium, osmium, zinc, molybdenum, tantalum, vanadium, or composites of such materials (e.g., niobium-titanium, niobium-aluminum, titanium-nitride, or niobium-tin). In some embodiments, the conductive contacts 140, 150, and/or 148 may include aluminum, and the first level interconnects 156 and/or the second level interconnects 158 may include an indium-based solder.

The conductive contacts 140, 150, and/or 148 may include multiple layers of material that may be selected to serve different purposes. In some embodiments, the conductive contacts 140, 150, and/or 148 may be formed of aluminum, and may include a layer of gold (e.g., with a thickness of less than 1 micron) between the aluminum and the adjacent interconnect to limit the oxidation of the surface of the contacts and improve the adhesion with adjacent solder. Alternate materials for the surface finish include palladium, platinum, silver and tin. In some embodiments, the conductive contacts 140, 150, and/or 148 may be formed of aluminum, and may include a layer of a barrier metal such as nickel, as well as a layer of gold, or other appropriate material, wherein the layer of barrier metal is disposed between the aluminum and the layer of gold, and the layer of gold is disposed between the barrier metal and the adjacent interconnect. In such embodiments, the gold, or other surface finish, may protect the barrier metal surface from oxidation before assembly, and the barrier metal may limit the diffusion of solder from the adjacent interconnects into the aluminum.

In some embodiments, the structures and materials in the SC quantum circuit 100 may be damaged if the SC quantum circuit 100 is exposed to the high temperatures that are common in conventional integrated circuit processing (e.g., greater than 100 degrees Celsius, or greater than 200 degrees Celsius). In particular, on embodiments in which the first level interconnects 156 include solder, the solder may be a low-temperature solder (e.g., a solder having a melting point below 100 degrees Celsius) so that it can be melted to couple the conductive contacts 140 and the conductive contacts 150 without having to expose the die 132 to higher temperatures and risk damaging the SC quantum circuit 100. Examples of solders that may be suitable include indium-based solders (e.g., solders including indium alloys). When low-temperature solders are used, however, these solders may not be fully solid during handling of the SC qubit device package 130 (e.g., at room temperature or temperatures between room temperature and 100 degrees Celsius), and thus the solder of the first level interconnects 156 alone may not reliably mechanically couple the die 132 and the package substrate 134 (and thus may not reliably electrically couple the die 132 and the package substrate 134). In some such embodiments, the SC qubit device package 130 may further include a mechanical stabilizer to maintain mechanical coupling between the die 132 and the package substrate 134, even when solder of the first level interconnects 156 is not solid. Since presence of any material that is lossy in terms of spurious TLSs may cause decoherence of the SC qubits 102, if used, such a mechanical stabilizer should be a material having relatively low losses in terms of TLSs.

As discussed above, in some embodiments, the conductive contacts 140 may provide the contacts from the SC quantum circuit 100 on the die 132 to couple to the package substrate 134, as discussed above. Additionally or alternatively, the conductive contacts 140 may provide the contacts from the SC quantum circuit 100 on the die 132 to couple other components, e.g. to another die, e.g. a control die shown in FIG. 4 and described in greater detail below.

Figure 4:
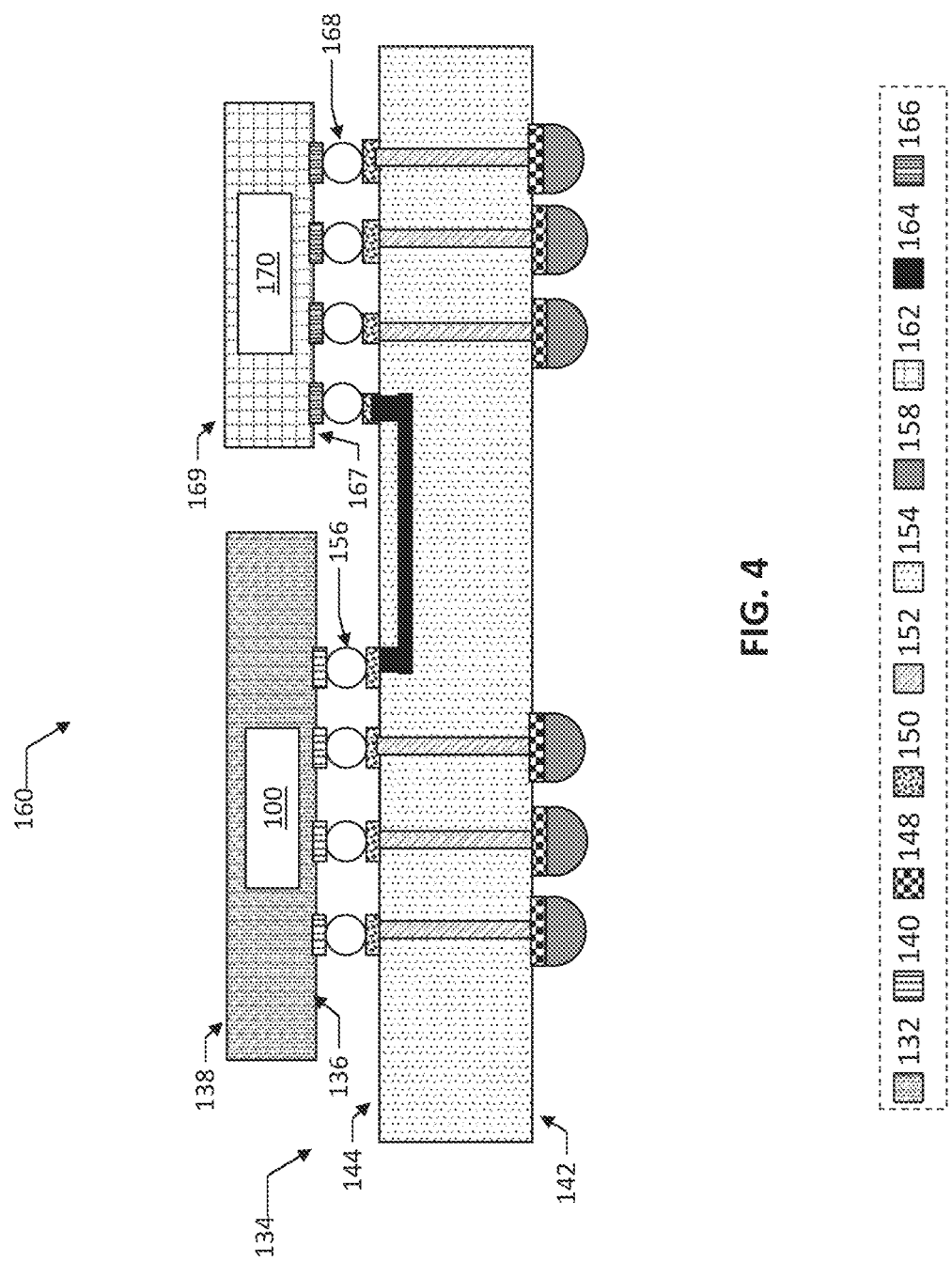
FIG. 4 provides a schematic illustration of an exemplary superconducting qubit device package coupling a die with a superconducting qubit device to another die via a package substrate, according to some embodiments of the present disclosure.

FIG. 4 illustrates a SC qubit device package 160 in which a SC quantum circuit 100 is included in a die 132, and the die 132 is coupled to another die 162 via the package substrate 134. The same reference numerals indicated in FIGS. 3 and 4 refer to the same or analogous elements. Therefore, description of these elements provided with respect to one of the FIGS. is applicable to other FIGS. and, in the interests of brevity, are not repeated. In particular, the left portion of FIG. 4 illustrates the die 132 coupled to the package substrate 134 as shown in FIG. 3 and described above. In addition, FIG. 4 further illustrates that some of the conductive contacts 140 of the SC qubit die 132 may be used to couple the die 132 to the die 162. In particular, FIG. 4 illustrates a conductive pathway 164 in the package substrate 162 electrically coupling the conductive contact 140 shown at the right edge of the die 132 and a corresponding conductive contact 166 shown at the left edge of the die 162. The pathway 164 could e.g. couple the conductive contacts 120, 122, or 126 of the SC quantum circuit 100 on the die 132 to the die 162. In other embodiments, additional conductive contacts of the die 132 and the die 162 could be similarly coupled.

While FIG. 4 shows only a single pathway 164, this is just for schematically illustrating the concept and, in various embodiments, a pathway for providing a single signal could include multiple separate pathways—e.g. one signal and one or more ground pathways. As described above, providing ground pathways may improve signal quality, enable fast pulse excitation and improve the isolation between the different lines.

Besides conductive contacts 166 on the die 162, FIG. 4 illustrates exemplary first level interconnects 168 between the die 162 and the package substrate 134, as well as conductive contacts 150 provided on the package substrate 134 for connecting to the conductive contacts of the die 162. The conductive contacts 166 and the first level interconnects 168 may be the same or analogous to the conductive contacts 140 and the first level interconnects 156 described above, except that in the embodiments where the die 162 is not a SC qubit die, then special measures described herein with respect to the SC quantum circuit 100 may not need to be taken. FIG. 4 also illustrates that the conductive contacts 150 provided on the package substrate 134 for connecting to the conductive contacts of the die 162 may be connected to the conductive contacts 148 on the opposite side of the package substrate 134, and to the second level interconnects 158, as described above.

Similar to FIG. 3, a number of elements referred in the description of FIG. 4 with reference numerals are indicated in FIG. 4 with different patterns, with a legend showing the correspondence between the reference numerals and patterns being provided at the bottom of FIG. 4, and are not labeled in FIG. 4 with arrows pointing to them in order to not clutter the drawing. For example, the legend illustrates that FIG. 4 uses different patterns to show the die 132, the conductive contacts 140, 148, 150, and 166, etc.

In some embodiments, the die 162 may also be a SC qubit die, similar to the die 132. In such embodiments, descriptions provided for the qubit die 132 are applicable to the die 162 and are not repeated here.

In other embodiments, the die 162 may include one or more non-quantum circuits, e.g. the die 162 may include control logic, shown in the example of FIG. 4 as a control logic 170, for controlling the operation of the SC quantum circuit 100 provided on the die 132, thus providing control logic integrated with the SC qubit die 132 on the same chip or the same package substrate 134. In some embodiments, the control logic 170 may provide peripheral logic to support the operation of the SC quantum circuit 100. For example, the control logic 170 may control the performance of a read operation, control the performance of a write operation, control the clearing of quantum bits, etc. The control logic 170 may also perform conventional computing functions to supplement the computing functions which may be provided by the SC quantum circuit 100. For example, the control logic 170 may interface with one or more of the other components of a quantum computing device, such as e.g. a quantum computing device 2000 described below, in a conventional manner, and may serve as an interface between the SC quantum circuit 100 and conventional components. In some embodiments, the control logic 170 may be implemented in or may be used to implement a non-quantum processing device 2028 described below with reference to FIG. 12. In various embodiments, mechanisms by which the control logic 170 controls operation of the SC quantum circuit 100 may be take the form of an entirely hardware embodiment, an entirely software embodiment (including firmware, resident software, micro-code, etc.) or an embodiment combining software and hardware aspects. For example, the control logic 170 may implement an algorithm executed by one or more processing units, e.g. one or more microprocessors, of one or more computers.

The control that the control logic 170 would exercise over the operation of the SC quantum circuit 100 would depend on the type of qubits that the quantum circuit component uses. For example, if the quantum circuit component uses superconducting qubits, the control logic 170 could be configured to provide appropriate currents in any of flux bias lines, microwave lines, and/or drive lines in order to initialize and manipulate the superconducting dots. Some examples of controlling the currents in these lines are explained above with reference to the devices 100 and 111. In the interests of brevity, these explanations are not repeated in detail here, but it is understood that, unless specified otherwise, all of the control mechanisms explained above may be performed by the control logic 170 shown in FIG. 4.

In some embodiments of superconducting qubits, the control logic 170 may be configured to detect current(s) in microwave line(s) and to control the operation of the SC quantum circuit 100 based on the detected current(s). By detecting current in a microwave line, the control logic 170 is able to assess/detect the state of the corresponding qubit(s) to which the line is coupled. In some further embodiments, the control logic 170 may further be configured to also control the current(s) in microwave line(s). By controlling the current in a microwave line, control logic is configured to control (e.g. change) the state of the corresponding qubit(s) to which the line is coupled. In such further embodiments, the control logic may be configured to switch operation of the microwave lines between controlling the current in the microwave lines to control states of the qubit(s) and detecting the current in the microwave lines to detect the states of the qubit(s). Thus, the control logic 170 can operate the microwave lines in a half-duplex mode where the microwave lines are either used for readout or for setting the state(s) of the corresponding qubits.

In some embodiments of superconducting qubits, the control logic 170 may be configured to control current(s) in one or more drive lines. By controlling the current in a drive line, control logic is configured to control (e.g. change) the state of the corresponding qubit(s) to which the line is coupled. When drive lines are used, the control logic can use the microwave lines for readout of the state(s) of the corresponding qubits and use the drive lines for setting the state(s) of the qubits, which would be an alternative to the half-duplex mode implementation described above. For example, the control logic 170 may be configured to control the current in the one or more drive lines by ensuring provision of one or more pulses of the current at a frequency of the one or more qubits. In this manner, the control logic 170 can provide a microwave pulse at the qubit frequency, which in turn stimulates (i.e. triggers) a transition between the states of the corresponding qubit. In some embodiments, the control logic 170 may be configured to control a duration of these pulses. By varying the length/duration of the pulse(s), the control logic 170 can stimulate a partial transition between the states of the corresponding qubit, giving a superposition of the states of the qubit.

In some embodiments, the control logic 170 may be configured to determine the values of the control signals applied to the elements of the SC quantum circuit 100, e.g. determine the voltages to be applied to the various gates of a quantum dot device or determine the currents to be provided in various lines of a superconducting qubit device. In other embodiments, the control logic 170 may be preprogrammed with at least some of the control parameters, e.g. with the values for the voltages to be applied to the various gates of a quantum dot device such as e.g. the device 100 during the initialization of the device.

Instead of providing the control functions from a chip that is typically remote from the SC quantum circuit 100, the integrated superconducting qubit device package 160 advantageously provides one or more control functions on the same chip or the same package substrate 134 as the quantum circuit die 132. This may be particularly advantageous for SC qubit circuits because it would allow providing a very large number of connections between the two chips which are typically needed for the transmon-type (or any SC qubit-type) resonators. Furthermore, using silicon or other inorganic substrate enables using superconducting interconnect lines which can provide lower losses thus avoiding the need for higher power transmission inside the cryogenic chamber and thus reducing the cooling power needed to operate the quantum computer effectively.

In some embodiments, the die 162 may further include circuits performing additional or different functionality than the control logic 170 described above. For example, the die 162 may include components of a wireless communication device, such as e.g. amplifiers, radio frequency (RF) receivers, RF transmitters, etc., in order to enable wireless communication between the SC qubit die 132 and various external devices.

Figure 5:
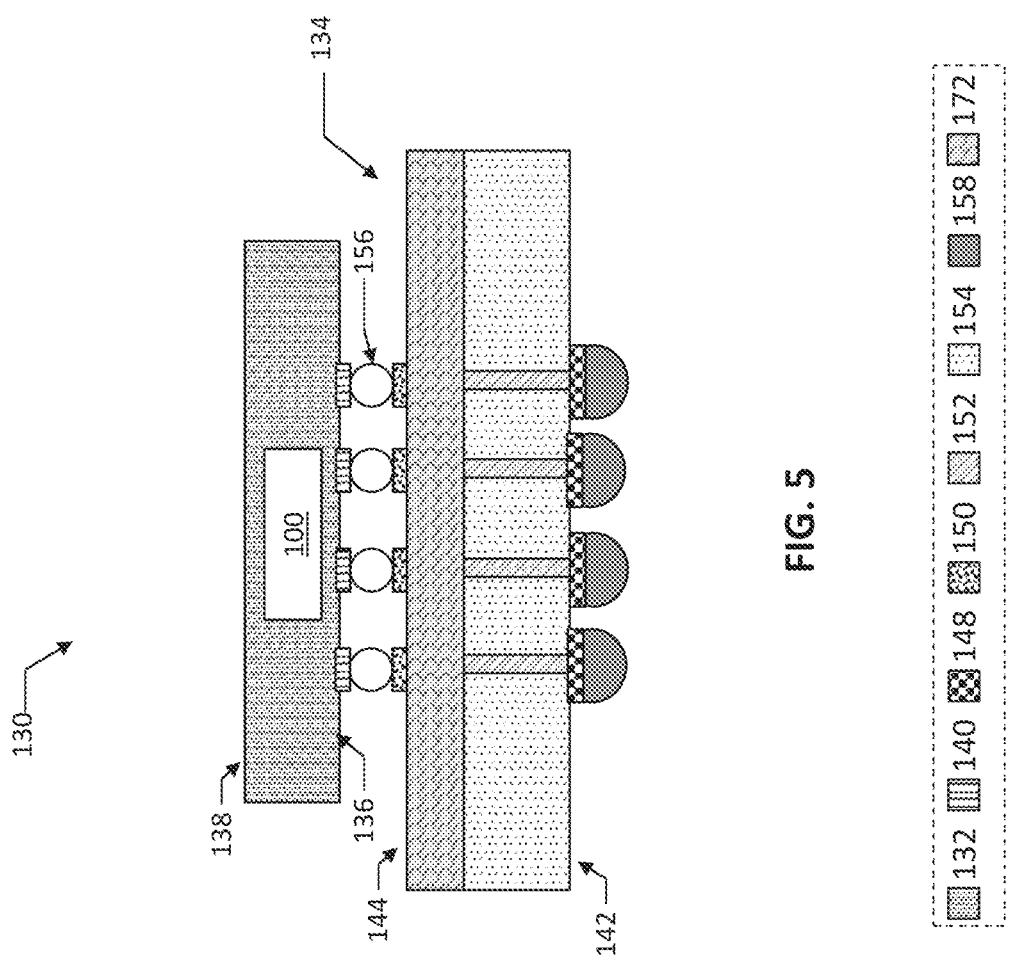
FIG. 5 provides a schematic illustration of an exemplary superconducting qubit device package coupling a die with a superconducting qubit device to a package substrate with a front metallization stack, according to some embodiments of the present disclosure.

It should be noted that both in FIGS. 3 and 4 the conductive contacts 150 of the package substrate 134 could electrically connect respective signal and ground connections of the dies 132 and 162. How electrical connections are made for the signal and ground conductive contacts on a die and on a package substrate is well-known in the art of packaging and, therefore, in the interests of brevity, not described here in detail. In general, connections are made by providing a metallization stack on, or as a part of, the second face 144 of the package substrate 134, schematically shown as a metallization stack 172 in FIG. 5. While FIG. 5 illustrates the SC qubit device package 130 of FIG. 3, all of the descriptions provided herein are also applicable to the SC qubit device package 160 shown in FIG. 4.

The metallization stack 172 typically includes a plurality of alternating dielectric layers 174 and conductive layers 176, as is schematically illustrated in FIG. 6, e.g. where each conducting layer 176 is electrically isolated from other conductive layers 176 by one or more dielectric layers 174. In various embodiments, the dielectric layers 174 may include one or more dielectric materials as described herein, e.g. with reference to the ILD or insulating material 154. The conductive layers 176 may include one or more electrically conducting, e.g. superconducting, materials as described herein, e.g. with reference to the conductive material of the conductive pathways 152.

A stack as shown in FIG. 6 is typically employed in packaging substrates in order to route electrical signals. Some of the conductive layers 176 may be used for the signal, while other conductive layers 176 may be used for providing the ground connections, as known in the art. The conductive layers 176 implement various conductive vias and lines as needed for a particular design of electrical routing. Although the different conductive vias and lines are not delineated with lines and are instead illustrated as a continuous structure in FIG. 6 (and other figures herein showing metallization stacks), conductive vias and lines that are in conductive contact may or may not be structurally and/or materially contiguous. The same is true for conductive vias/lines and conductive contacts that are in conductive contact.

In conventional classical (i.e. non-quantum) circuits, typically, the thickness of each of the dielectric layers is at least 2 micrometers (microns), while the thickness of each of the conductive layers is at least 1 micron. Such relatively thick layers are generally needed in conventional, higher-temperature, silicon interposers to achieve adequate signal quality since such interposers employ non-superconducting transmission lines which, when made thinner, have high losses and reduced signal fidelity. However, in contrast to non-quantum circuits, the conductive layers of quantum circuits can be made of superconductive materials, which would allow both conducting and dielectric layers can be much thinner without significantly impacting the signal quality. In turn, reducing the thicknesses of the layers can significantly simplify the manufacturing since thick superconducting layers are challenging to fabricate reliably. In some embodiments, the thickness of each of the dielectric layers 174 shown in FIG. 6 may be between 0.2 and 0.3 microns, while the thickness of each of the conductive layers 176 may be between 0.2 and 0.3 microns. Furthermore, using dielectric layers which are sufficiently thin, as proposed herein, reduces their negative impact on the quality factor of the resonators, described above. Still further, thinner dielectric layers allow using narrower transmission lines while still achieving a standard characteristic impedance for the transmission lines (e.g. 50 ohms or 100 ohms), and using narrower transmission lines enables larger number of interconnects between the dies on the package substrate.

Figure 7B:
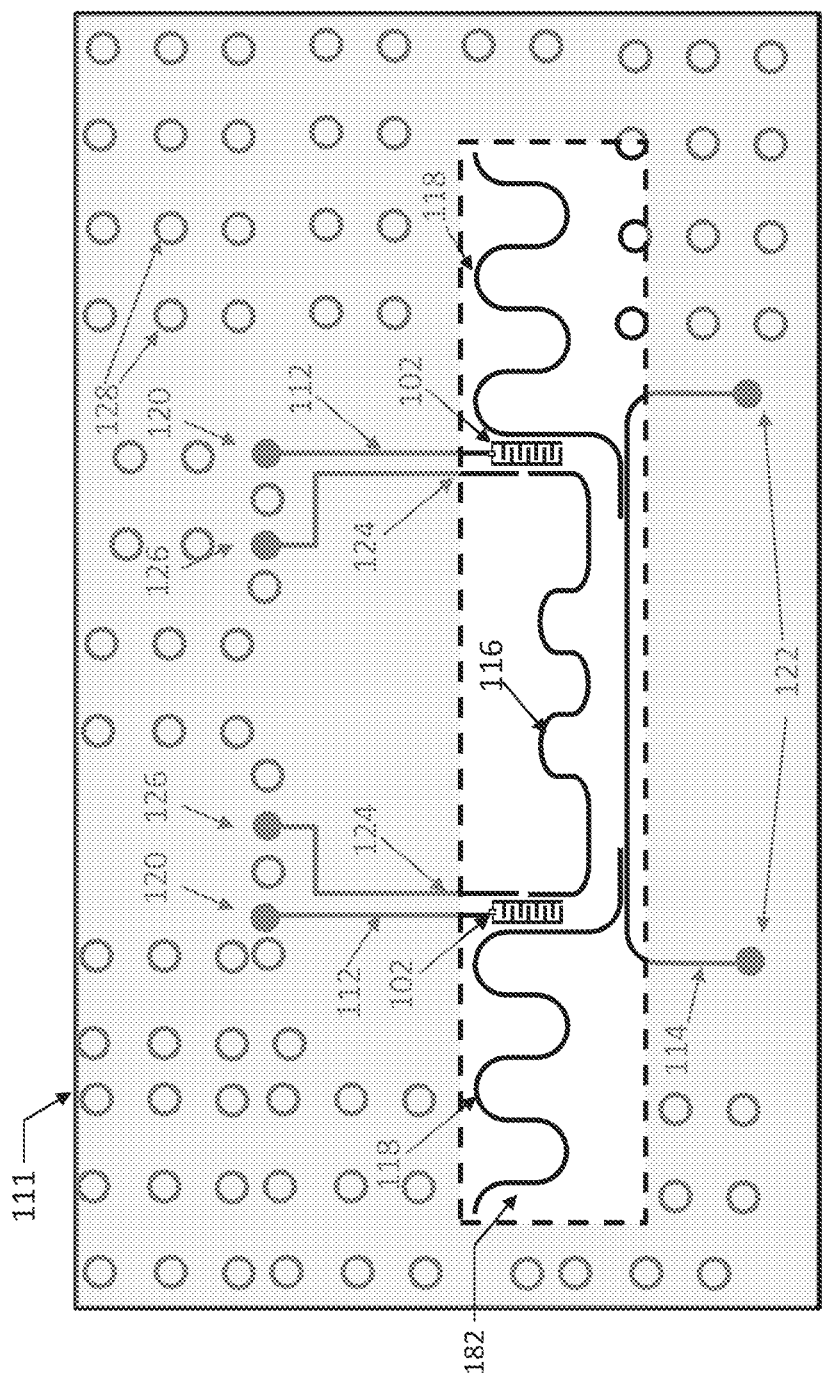
FIG. 7B provides a schematic illustration of a top view of an area as shown in FIG. 7A where dielectric layer(s) and/or metal layers of the top metallization stack of the package substrate may be voided, according to some embodiments of the present disclosure.

Another aspect that is unique to quantum circuits is that the dielectric layers 174 could add to losses in terms of having spurious TLSs which lead to qubit decoherence, especially if provided in the proximity of the resonators of the SC quantum circuit provided on the die 132 as described herein. Therefore, in some embodiments, dielectric material of the upper dielectric layer 174 could be removed in the vicinity of the resonators 116 and/or 118 disposed on the first face 136 of the die 132, so that the material facing these resonators it that of the conductive layers 176. This is schematically illustrated in FIG. 7A, showing a SC qubit device package 180. The device package 180 may be the SC qubit device package 130 or the qubit device package 160 (for the latter, the second die 162 is simply not shown in FIG. 7A) and may include all of the components of the packages 130 and 160 as described above. However, in order to not clutter the drawing, FIG. 7A only shows some but not all of the elements of the packages 130 and 160 as shown in FIGS. 3 and 4. Instead, FIG. 7A focuses on showing that the metallization stack 172 facing the SC quantum circuit 100 provided on the first face 136 of the die 132 may include areas such as an area 182 where the dielectric material of the upper dielectric layer 174 and/or the conductive layer 176 is removed in the vicinity of resonators of the SC quantum circuit 100 shown as a resonator 184 in FIG. 7A. The resonator 184 may be, e.g., one of the coupling or readout resonators of a SC quantum circuit, e.g., one of the resonator 116 or 118 shown in FIG. 2. The area 182 may, e.g., be the area as indicated with a dashed box in the exemplary physical layout shown in FIG. 7B which is the same illustration as that of FIG. 2 except that all of the areas outside of the area 182 are shown as shaded, whereas the area 182, within the dashed box illustrated in FIG. 7B, remains unshaded as in FIG. 2. Thus, the view of FIG. 7B may be considered as an exemplary top view of the cross-section shown in FIG. 7A, with FIG. 7A showing only a small part of the layout shown in FIG. 7B. Of course, in other embodiments, the shape of the area 182 in plane of the package substrate 134 may be different than a rectangle shown in FIG. 7B, as long as the shape is such that electromagnetic fields from the resonator 184 are not substantially affected by the potentially lossy material of the dielectric layer 174 under the resonator.

Removing the dielectric material of the upper dielectric layer 174 under the resonator 184 until the conductive layer 176 is exposed results in the electromagnetic fields from the resonator 184 extending, at most, to the top conductive layer 176 which has much smaller losses than the dielectric material of the upper dielectric layer 174, especially if the top conductive layer 176 is made of one or more superconductive materials. This, in turn, allows making the dielectric layers 174 thicker, which could be desirable because, in some embodiments, only one superconducting layer may be used (e.g., only the top layer) and in this case, thicker dielectric and thicker non-superconducting conductive layers may be used. One example when this could be useful is in using the same manufacturing flow as a standard silicon interposer then adding one superconducting and dielectric layer on top, which could help leverage existing silicon infrastructure and reduce the manufacturing cost. In some embodiments, the thickness of each of the dielectric layers 174 shown in FIG. 7A may be between 1 and 4 microns, while the thickness of the topmost conductive layers 176 may be the same as described above for FIG. 6, e.g., between 0.2 and 0.3 microns, whereas the other conductive layers may be in the order of 1 to 4 microns thick.

Figure 8:
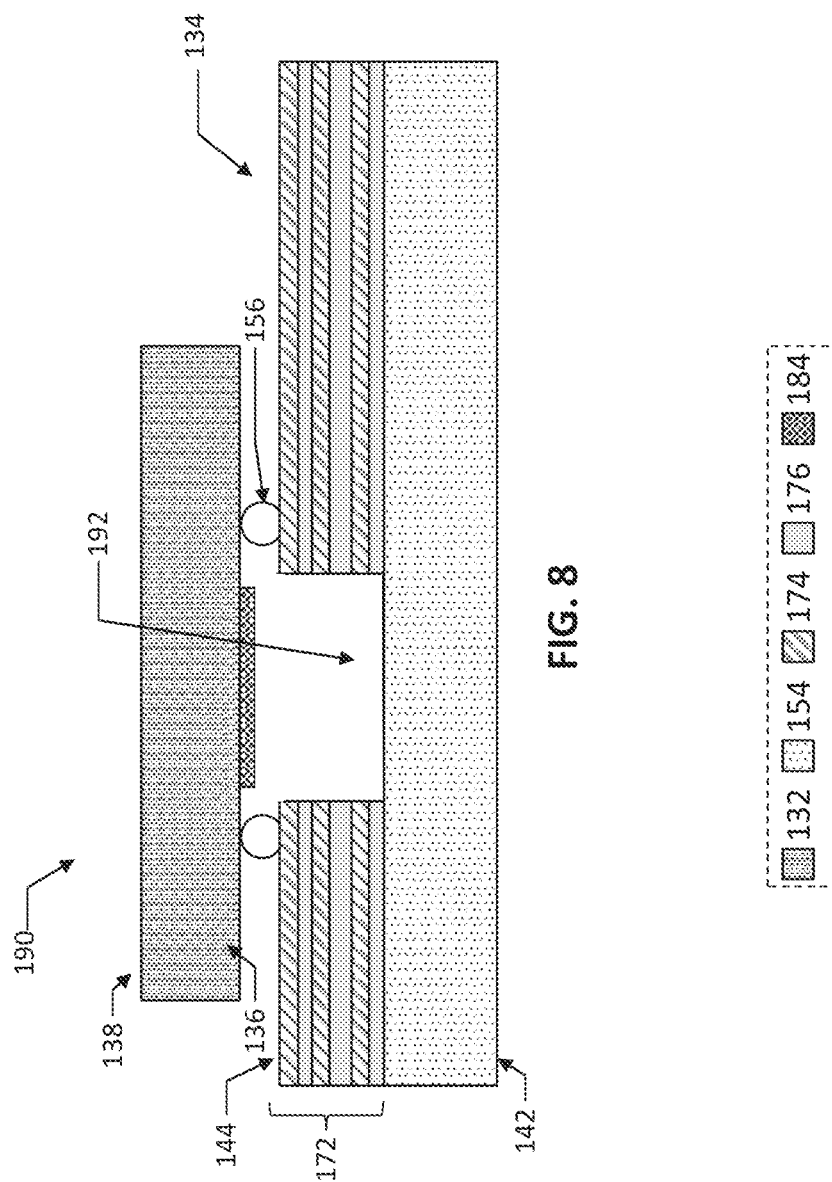
FIG. 8 provides a schematic illustration of an exemplary superconducting qubit device package including voided areas of a metallization stack of a package substrate when coupling to a die with a superconducting qubit device, according to some embodiments of the present disclosure.

As described above, the conductive layers 176 could be made of one or more superconducting materials. When this is not the case (i.e. the conductive layers 176 are made of one or more electrically conductive, but not superconductive, materials), these layers could also add to losses, especially if provided in the proximity of the resonators of the SC quantum circuit provided on the die 132 as described herein. Therefore, in some embodiments, the entire portions of the metallization stack 172 could be removed in the vicinity of the resonators 116 and/or 118 disposed on the first face 136 of the die 132, so that the material facing these resonators it that of the package substrate 134, e.g. the insulating material 154 which could e.g. include crystalline silicon. This is schematically illustrated in FIG. 8, showing a SC qubit device package 190. The device package 190 may be the SC qubit device package 130 or the qubit device package 160 (for the latter, the second die 162 is simply not shown in FIG. 9) and may include all of the components of the packages 130 and 160 as described above. However, similar to FIG. 7A, in order to not clutter the drawing, FIG. 8 only shows some but not all of the elements of the packages 130 and 160 as shown in FIGS. 3 and 4. Instead, FIG. 8 focuses on showing that the metallization stack 172 facing the SC quantum circuit 100 provided on the first face 136 of the die 132 may be completely removed in areas such as an area 192, in the vicinity of resonators of the SC quantum circuit 100 shown as the resonator 184 in FIG. 8. FIG. 8 may be viewed as an extension of FIG. 7A in that more layers of the metallization stack 172 are removed in some areas. Considerations described above with reference to the area 182 are applicable to the area 192 (in particular, the view of FIG. 7B) and, therefore, in the interests of brevity, are not repeated here.

Removing the metallization stack 172 under the resonator 184 until the insulating material 154 of the package substrate 134 is exposed results in the electromagnetic fields from the resonator 184 extending, at most, to the insulating material 154 which has much smaller losses than the materials of the metallization stack 172. In this situation, standard silicon interposer manufacturing technique maybe used (with non-superconducting conductive layers, e.g. copper) but with an extra dielectric etching step (e.g. dry or wet etch). This may enable quick turn manufacturing and leverage existing infrastructure and materials. In some embodiments, the thickness of each of the dielectric layers 174 and the thickness of each of the conductive layers 176 shown in FIG. 8 may be between 1 and 4 microns. In addition, the conductive layers 176 may be made from non-superconductive materials without substantial sacrifice in the performance of the SC quantum circuit 100 disposed on the first face 136 of the die 132.

In still further embodiments, SC qubit device packages may include implementations in between the scenarios shown in FIGS. 7A and 8, i.e. where more than one, but not all, of the layers of the metallization stack 172 are removed in the vicinity of the resonators 116 and 118 of the SC quantum circuit 100.

A package substrate 134 for any of the SC qubit device packages described herein may be manufactured using any suitable technique, e.g. using any of the subtractive manufacturing process or/and semi-additive manufacturing processes as known in the art. The package substrate 134 may be provided on a carrier that may provide mechanical support during manufacture, and may be formed of any suitable material (e.g., a metal sheet, a dielectric material, or a reinforced dielectric material). During manufacturing of the package substrate 134, conductive materials as described herein may be deposited on the carrier to any desired thickness using any suitable technique (e.g., sputtering, electroplating, electroless plating, lamination, etc.) and patterned using any suitable technique, e.g. as a part of forming the conductive contacts 148. For example, the conductive materials of the package substrate 134 may be patterned by providing a mask material (e.g., by lamination, spin coating, or slit coating), patterning the mask material (e.g., by photolithography, laser direct imaging, electron beam lithography, etc.), and etching the conductive material in accordance with the patterned mask material (e.g., using wet or dry etching), and removing the remaining mask material). The insulating material of the package substrate 134, e.g. the insulating material 154, may also be provided using any suitable technique (e.g., lamination or spin coating), and may cover or surround the conductive materials, e.g. surround the conductive pathways and conductive contacts of the package substrate 134, as described herein. The insulating material may be, for example, a dielectric material, as discussed above. Furthermore, during the manufacturing of the package substrate 134, cavities may be formed in the insulating material, e.g. as a part of forming the conductive pathways 152. The cavities may extend through the package substrate 134, e.g. down to the conductive contacts 148. In some embodiments, the cavities may be tapered so as to be narrower proximate to the conductive contacts 148, as shown e.g. in FIG. 3. The cavities may be formed using any suitable technique (e.g., laser or mechanical drilling, or using photolithography for photoimageable insulating material 154). In some embodiments, the cavities may be drill holes. The cavities may be filled with a same or different conductive material than the one described above for forming the conductive contacts 148. In some embodiments, the conductive material filling the cavities may be a superconducting material. Additional conductive contacts may be provided on the package substrate, e.g. the conductive contacts 150 on the second face of the package substrate 134, e.g. by repeating at least some of the operations discussed above, as appropriate, and may be insulated by additional insulating material. Manufacturing of the package substrate 134 may further include providing the solder resist material on one or both faces of the substrate using any suitable technique (e.g., lamination or spin coating), patterning the solder resist material using any suitable technique (e.g., photolithography), and removing the carrier from the assembly of the package substrate.

In some embodiments of the manufacturing of the package substrate 134, an adhesion material may be disposed between the insulating materials and adjacent conductive materials. For example, a layer of titanium may be provided (e.g., by sputtering) between the insulating material 154 and the conductive material of the conductive pathways 152 (e.g., a superconducting material) to improve the interface between the two. In other embodiments, a layer of sputtered or spray-coated organic adhesion promoter (e.g., a copolyamide-based promoter) may be provided between the insulating material and adjacent conductive material. In some embodiments, the surface of the insulating material may be mechanically or chemically roughened before deposition of conductive material (e.g., a superconducting material) to improve adhesion. In some embodiments, the insulating material (e.g., a dielectric material) of the package substrate 154 may include adhesion promoters, which may be activated at the surface of the insulating material (prior to deposition of the conductive material) using an etching, plasma treatment, or laser process.

In some embodiments, additive manufacturing operations may be used instead of, or in addition to, the subtractive techniques. For example, manufacture of a package substrate for a SC qubit device package may include various alternative semi-additive stages, in accordance with various embodiments. Such stages may include e.g. providing a seed layer on the carrier for the future package substrate 134, where the seed layer may, in some embodiments, be a superconducting material (e.g., any of the superconducting materials discussed herein), and may serve as a thin seed layer for a subsequent electroplating operation (discussed below). The seed layer may be provided on the carrier to any desired thickness using any suitable technique (e.g., sputtering). In some embodiments, the seed layer may be formed of tin or aluminum. Subsequently, a patterned mask material may be provided on the seed layer, the mask formed by e.g. depositing the mask material using any suitable technique, and then patterning the mask material to form cavities that extend down to the seed layer (e.g., using any of the techniques for forming cavities discussed above). After that, conductive material may be electroplated with the seed layer serving as the starting point for the electroplating. In some embodiments, the electroplated conductive material may extend over the mask material. In such embodiments, this "express" conductive material may be polished back to form the assembly, e.g. using chemical mechanical polishing (CMP). In some embodiments, the electroplated conductive material may be tin or aluminum. The mask material may be subsequently removed and certain portion of the conductive material may be etched to remove a desired thickness of the conductive material.

In various embodiments, conductive pathways 152, and additional vias, lines, and contacts, may be built up to form the package substrate 134 by repeating various operations described above. In various embodiments, adjacent vias and lines of the package substrate 134 may be formed separately (e.g., in a Damascene process) or at the same time (e.g., in a dual Damascene process).

The subtractive techniques discussed above may be advantageously used when the materials or structures of the package substrate 134 (and the first level interconnects 156 and the die 132) may be damaged by exposure to the high temperatures typically used in semi-additive processes. For example, certain sputtering processes may operate at relatively high temperatures, as do certain electroplating and etching baths (although some may be operated at lower temperature at the expense of throughput). Additionally, if a desired conductive material (e.g., a superconducting material) is relatively "easy" to etch, but difficult to electroplate, subtractive techniques may be advantageous. However, semi-additive techniques may enable smaller feature sizes in the package substrate 134, so the appropriate manufacturing techniques may be application dependent.

In some embodiments, some or all of the operations discussed above for manufacturing a package substrate 134 may be performed on both "sides" of the package substrate 134 (e.g., forming the first surface 142 and the second surface 144) substantially simultaneously. Such an approach may be used with coreless package substrates 134, for example, and may achieve higher throughput (and thus reduce manufacturing cost). Examples of operations that may be performed on both sides of a package substrate 134 simultaneously may include wet etching, photoresist development, and electroplating, among others.

In some embodiments, any one of the SC qubit device packages described herein may be a cored package, one in which the package substrate 134 is built on a carrier material (not shown) that remains in the package substrate 134. In such embodiments, the carrier material may be a dielectric material that is part of the insulating material 154; laser vias or other through-holes may be made through the carrier material to allow conductive pathways 152 to extend between the first surface 142 and the second surface 144.

Figure 9B:
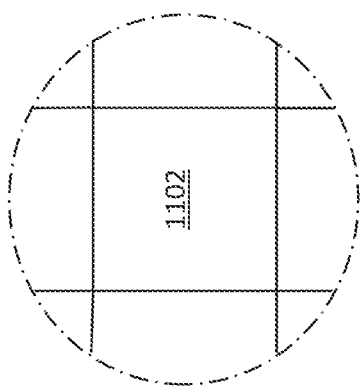
FIGS. 9A and 9B are top views of a wafer and dies that may include any of the superconducting qubit devices disclosed herein.
Figure 9A:
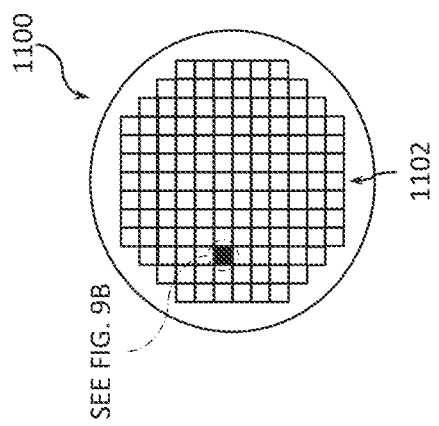

FIGS. 9A-B are top views of a wafer 1100 and dies 1102 that may be formed from the wafer 1100; the dies 1101 may be included in any of the SC qubit device packages disclosed herein, e.g., the SC qubit device packages 130, 160, 180, 190, or any combinations of these packages. The wafer 1100 may include semiconductor material and may include one or more dies 1102 having conventional and SC qubit device elements formed on a surface of the wafer 1100. Each of the dies 1102 may be a repeating unit of a semiconductor product that includes any suitable conventional and/or SC qubit device. After the fabrication of the semiconductor product is complete, the wafer 1100 may undergo a singulation process in which each of the dies 1102 is separated from one another to provide discrete "chips" of the semiconductor product. A die 1102 may include one or more SC qubit devices 100 and/or supporting circuitry to route electrical signals to the SC qubit devices 100 (e.g., interconnects connected to the conductive contacts 120/122/126, and other conductive vias and lines), as well as any other IC components. In some embodiments, the wafer 1100 or the die 1102 may include a memory device (e.g., a static random access memory (SRAM) device), a logic device (e.g., AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 2002 of FIG. 12) or other logic that is configured to store information in the memory devices or execute instructions stored in the memory array.

FIG. 10 is a cross-sectional side view of a device assembly 1300 that may include any of the embodiments of the SC qubit device packages disclosed herein. The device assembly 1300 includes a number of components disposed on a circuit board 1302. The device assembly 1300 may include components disposed on a first face 1340 of the circuit board 1302 and an opposing second face 1342 of the circuit board 1302; generally, components may be disposed on one or both faces 1340 and 1342.

In some embodiments, the circuit board 1302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1302. In other embodiments, the circuit board 1302 may be a package substrate or flexible board.

The IC device assembly 1300 illustrated in FIG. 10 includes a package-on-interposer structure 1336 coupled to the first face 1340 of the circuit board 1302 by coupling components 1316. The coupling components 1316 may electrically and mechanically couple the package-on-interposer structure 1336 to the circuit board 1302, and may include solder balls (as shown in FIG. 10), male and female portions of a socket, an adhesive, an underfill material, and/or any other suitable electrical and/or mechanical coupling structure.

The package-on-interposer structure 1336 may include a package 1320 coupled to an interposer 1304 by coupling components 1318. The coupling components 1318 may take any suitable form for the application, such as the forms discussed above with reference to the coupling components 1316. For example, the coupling components 1318 may be the second level interconnects 308. Although a single package 1320 is shown in FIG. 10, multiple packages may be coupled to the interposer 1304; indeed, additional interposers may be coupled to the interposer 1304. The interposer 1304 may provide an intervening substrate used to bridge the circuit board 1302 and the package 1320. The package 1320 may be a SC qubit device package as described herein, e.g. one of the SC qubit device package 130, 160, 180, 190, or a combination thereof, or may be a conventional IC package, for example. In some embodiments, the package 1320 may take the form of any of the embodiments of the SC qubit device packages disclosed herein, and may include a SC qubit device die 132 coupled to a package substrate 134 (e.g., by flip chip connections) implemented as the interposer 1304. Generally, the interposer 1304 may spread a connection to a wider pitch or reroute a connection to a different connection. For example, the interposer 1304 may couple the package 1320 (e.g., a die) to a ball grid array (BGA) of the coupling components 1316 for coupling to the circuit board 1302. In the embodiment illustrated in FIG. 10, the package 1320 and the circuit board 1302 are attached to opposing sides of the interposer 1304; in other embodiments, the package 1320 and the circuit board 1302 may be attached to a same side of the interposer 1304. In some embodiments, three or more components may be interconnected by way of the interposer 1304.

The interposer 1304 may be formed of an epoxy resin, a fiberglass-reinforced epoxy resin, a ceramic material, or a polymer material such as polyimide. In some embodiments, the interposer 1304 may be formed of alternate rigid or flexible materials that may include the same materials described above for use in a semiconductor substrate, such as silicon, germanium, and other group III-V and group IV materials. The interposer 1304 may include metal interconnects 1308 and vias 1310, including but not limited to through-silicon vias (TSVs) 1306. The interposer 1304 may further include embedded devices 1314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 1304. The package-on-interposer structure 1336 may take the form of any of the package-on-interposer structures known in the art.

The device assembly 1300 may include a package 1324 coupled to the first face 1340 of the circuit board 1302 by coupling components 1322. The coupling components 1322 may take the form of any of the embodiments discussed above with reference to the coupling components 1316, and the package 1324 may take the form of any of the embodiments discussed above with reference to the package 1320. The package 1324 may be a SC qubit device package or may be a conventional IC package, for example. In some embodiments, the package 1324 may take the form of any of the embodiments of the SC qubit device package as described herein, e.g. one of the SC qubit device package 130, 160, 180, 190, or a combination thereof disclosed herein, and may include a SC qubit device die 132 coupled to a package substrate 134 (e.g., by flip chip connections).

The device assembly 1300 illustrated in FIG. 10 includes a package-on-package structure 1334 coupled to the second face 1342 of the circuit board 1302 by coupling components 1328. The package-on-package structure 1334 may include a package 1326 and a package 1332 coupled together by coupling components 1330 such that the package 1326 is disposed between the circuit board 1302 and the package 1332. The coupling components 1328 and 1330 may take the form of any of the embodiments of the coupling components 1316 discussed above, and the packages 1326 and 1332 may take the form of any of the embodiments of the package 1320 discussed above. Each of the packages 1326 and 1332 may be a SC qubit device package as described herein or may be a conventional IC package, for example. In some embodiments, one or both of the packages 1326 and 1332 may take the form of any of the embodiments of a SC qubit device package as described herein, e.g. one of the SC qubit device package 130, 160, 180, 190, or a combination thereof, and may include a SC qubit device die 132 coupled to a package substrate 134 (e.g., by flip chip connections).

Figure 11:
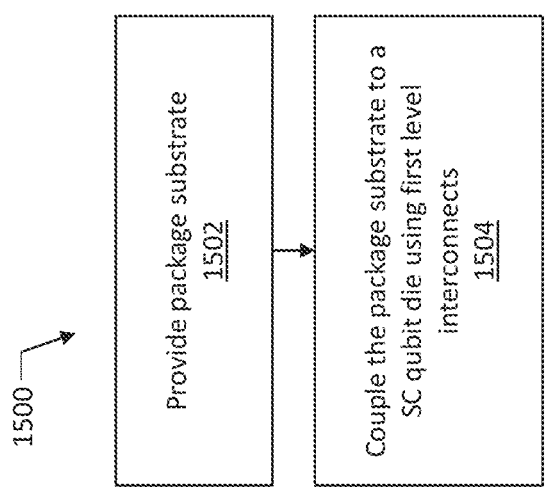
FIG. 11 is a flow diagram of an illustrative method of manufacturing a superconducting qubit device package, in accordance with various embodiments.

As noted above, any suitable techniques may be used to manufacture the SC qubit devices 100 and the SC qubit device packages 130, 160, 180, and 190 (and their combinations) disclosed herein. FIG. 11 is a flow diagram of an illustrative method 1500 of manufacturing a SC qubit device package, in accordance with various embodiments. Although the operations discussed below with reference to the method 1500 are illustrated in a particular order and depicted once each, these operations may be repeated or performed in a different order (e.g., in parallel), as suitable. Additionally, various operations may be omitted, as suitable. Various operations of the method 1500 may be illustrated with reference to one or more of the embodiments discussed above, but the method 1500 may be used to manufacture any suitable SC qubit device package (including any suitable ones of the embodiments disclosed herein).

At 1502, a package substrate is provided. The package substrate provided at 1502 may take form according to any of the embodiments of the package substrate 134 described herein and may be formed using e.g. manufacturing operations described above. The package substrate may include areas with voided one or more layers of the upper metallization stack, as e.g. described with reference to FIGS. 7 and 8 above.

At 1504, the package substrate is coupled to a die on which one or more of SC qubit circuits/devices are provided, using first level interconnects, as described herein. The die couples to the package substrate at 1504 may take form according to any of the embodiments of the SC qubit circuit die 132 described herein. The first level interconnects provided at 1504 may take form according to any of the embodiments of the first level interconnects 156 described herein.

Figure 12:
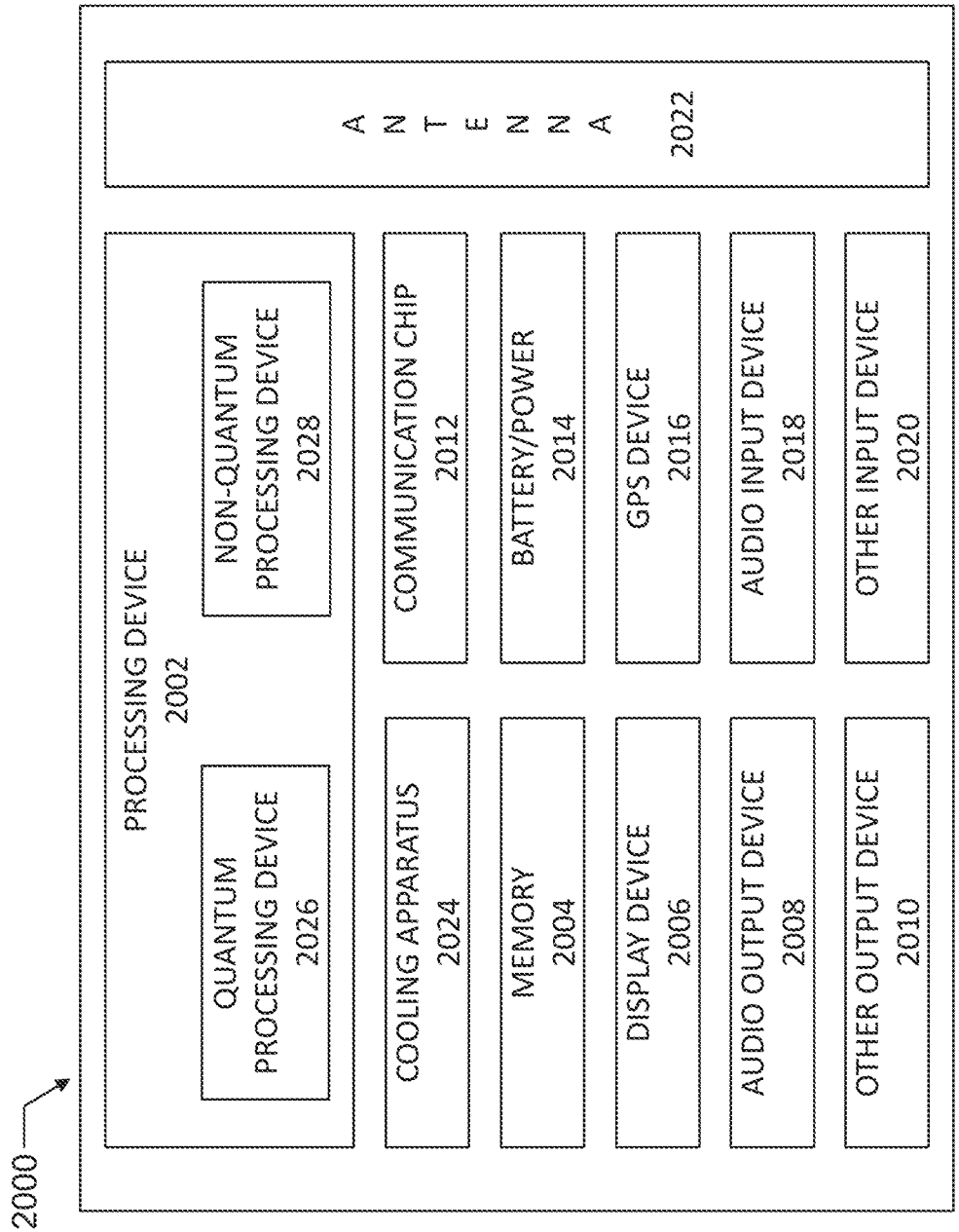
FIG. 12 is a block diagram of an example quantum computing device that may include any of the superconducting qubit devices disclosed herein, in accordance with various embodiments.

FIG. 12 is a block diagram of an example quantum computing device 2000 that may include any of the SC qubit devices disclosed herein (e.g., any of the SC qubit device packages disclosed herein). A number of components are illustrated in FIG. 12 as included in the quantum computing device 2000, but any one or more of these components may be omitted or duplicated, as suitable for the application. In some embodiments, some or all of the components included in the quantum computing device 2000 may be attached to one or more printed circuit boards (e.g., a motherboard), and may be included in any of the SC qubit device packages described herein. In some embodiments, various ones of these components may be fabricated onto a single system-on-a-chip (SoC) die. Additionally, in various embodiments, the quantum computing device 2000 may not include one or more of the components illustrated in FIG. 12, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2024 or an audio output device 2008, but may include audio input or output device interface circuitry (e.g., connectors and supporting circuitry) to which an audio input device 2024 or audio output device 2008 may be coupled.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include one or more of the SC qubit devices 100 disclosed herein, and may perform data processing by performing operations on the SC qubits that may be generated in the SC qubit devices 100, and monitoring the result of those operations. For example, as discussed above, different SC qubits may be allowed to interact, the quantum states of different SC qubits may be set or transformed, and the quantum states of SC qubits may be read (e.g., by another SC qubit). The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random-access memory (STT-M RAM).

The quantum computing device 2000 may include a cooling apparatus 2030. The cooling apparatus 2030 may maintain the quantum processing device 2026 at a predetermined low temperature during operation to reduce the effects of scattering in the quantum processing device 2026. This predetermined low temperature may vary depending on the setting; in some embodiments, the temperature may be 5 degrees Kelvin or less. In some embodiments, the non-quantum processing device 2028 (and various other components of the quantum computing device 2000) may not be cooled by the cooling apparatus 2030, and may instead operate at room temperature. The cooling apparatus 2030 may be, for example, a dilution refrigerator, a helium-3 refrigerator, or a liquid helium refrigerator.

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as GPS, EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output).

The quantum computing device 2000 may include a global positioning system (GPS) device 2018 (or corresponding interface circuitry, as discussed above). The GPS device 2018 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The following paragraphs provide examples of various ones of the embodiments disclosed herein.

Example 1 provides a superconducting qubit device package, including a die having a first face and an opposing second face, a package substrate, and first level interconnects. The die may include a quantum device including a plurality of superconducting qubits disposed on the first face of the die, a plurality of resonators disposed on the first face of the die, and a plurality of conductive pathways coupled between conductive contacts at the first face of the die and associated ones of the plurality of superconducting qubits or associated ones of the plurality of resonators. The package substrate has a first face and an opposing second face, where conductive contacts are disposed at the second face of the package substrate. The first level interconnects may be disposed between the first face of the die and the second face of the package substrate, coupling the conductive contacts at the first face of the die with associated conductive contacts at the second face of the package substrate.

Example 2 provides the superconducting qubit device package according to Example 1, where the conductive contacts at the second face of the package substrate are coupled to two or more conductive layers of a metallization stack provided at the second face of the package substrate.

Example 3 provides the superconducting qubit device package according to Example 2, where the metallization stack may include the two or more conductive layers separated from one another by dielectric layers. In other Examples, the metallization stack may include just one conductive layer and one or more dielectric layers.

Example 4 provides the superconducting qubit device package according to Example 3, where each of the two or more conductive layers and each of the dielectric layers has a thickness between 0.2 and 0.3 micrometers.

Example 5 provides the superconducting qubit device package according to Example 3, where a dielectric material of the dielectric layers is absent in one or more areas opposite the plurality of resonators.

Example 6 provides the superconducting qubit device package according to Example 3, where the metallization stack is absent in one or more areas opposite the plurality of resonators.

Example 7 provides the superconducting qubit device package according to any one of Examples 4-6, where the each of the two or more conductive layers may include one or more superconductive materials.

Example 8 provides the superconducting qubit device package according to any one of the preceding Examples, where the die is a first die and the package further includes a second die and additional first level interconnects. The second die may have a first face and an opposing second face and may include one or more conductive contacts at the first face. The additional first level interconnects may be disposed between the first face of the second die and the second face of the package substrate, coupling the conductive contacts at the first face of the second die with associated conductive contacts at the second face of the package substrate.

Example 9 provides the superconducting qubit device package according to Example 8, where the second die may include one or more non-quantum devices.

Example 10 provides the superconducting qubit device package according to any one of the preceding Examples, where the plurality of conductive pathways coupled between the conductive contacts at the first face of the die and the associated ones of the plurality of superconducting qubits or the associated ones of the plurality of resonators include a plurality of flux bias lines coupled between the conductive contacts at the first face of the die and the associated ones of the plurality of superconducting qubits.

Example 11 provides the superconducting qubit device package according to Example 10, where the first level interconnects and the package substrate are configured to enable provision of current, from a control logic to the plurality of flux bias lines, for tuning a resonant frequency of each of the plurality of superconducting qubits.

Example 12 provides the superconducting qubit device package according to any one of the preceding Examples, where the plurality of conductive pathways coupled between the conductive contacts at the first face of the die and the associated ones of the plurality of superconducting qubits or the associated ones of the plurality of resonators include a plurality of drive lines coupled between the conductive contacts at the first face of the die and the associated ones of the plurality of superconducting qubits.

Example 13 provides the superconducting qubit device package according to Example 12, where the first level interconnects and the package substrate are configured to enable provision of current, from a control logic to the plurality of readout lines, for controlling a quantum state of each of the plurality of superconducting qubits.

Example 14 provides the superconducting qubit device package according to any one of the preceding Examples, where the plurality of conductive pathways coupled between the conductive contacts at the first face of the die and the associated ones of the plurality of superconducting qubits or the associated ones of the plurality of resonators include a plurality of readout lines coupled between the conductive contacts at the first face of the die and associated readout resonators of the plurality of resonators.

Example 15 provides the superconducting qubit device package according to Example 14, where the first level interconnects and the package substrate enable a control logic to detect current in the plurality of readout lines, for detecting a quantum state of each of the plurality of superconducting qubits.

Example 16 provides the superconducting qubit device package according to any one of the preceding Examples, where the package substrate may include a silicon interposer.

Example 17 provides the superconducting qubit device package according to any one of the preceding Examples, where the package substrate and the die are made from a same material.

Example 18 provides the superconducting qubit device package according to any one of Examples 1-17, where the first level interconnects include a solder, and the solder may include indium.

Example 19 provides the superconducting qubit device package according to any one of Examples 1-17, where the first level interconnects include a solder, and the solder may include bismuth or gallium.

Example 20 provides the superconducting qubit device package according to any one of Examples 1-17, where the first level interconnects include a solder having a melting point that is less than 180 degrees Celsius.

Example 21 provides a method of manufacturing a superconducting qubit device package. The method includes coupling conductive contacts of a die to conductive contacts on a package substrate through first level interconnects disposed between the die and the package substrate. The die may have a first face and an opposing second face and may include a quantum device including a plurality of superconducting qubits and a plurality of resonators. The conductive contacts of the die are disposed on the first face of the die. The die may further include a plurality of conductive pathways coupled between the conductive contacts of the die and associated ones of the plurality of superconducting qubits or associated ones of the plurality of resonators. The package substrate may have a first face and an opposing second face and the conductive contacts on the package substrate are disposed at the second face of the package substrate.

Example 22 provides the method according to Example 21, further including, prior to coupling the conductive contacts of the die to the conductive contacts on the package substrate, coupling the conductive contacts on the package substrate to two or more conductive layers of a metallization stack at the second face of the package substrate, and ensuring absence of a dielectric material of the dielectric layers or the metallization stack in one or more areas over the package substrate. Absence of the dielectric material may be ensured by either removing the dielectric material that was deposited in those areas or not depositing the dielectric material in those areas to begin with (e.g. by using a mask during the deposition).

Example 23 provides the method according to Example 22, where the conductive contacts of the die are coupled to the conductive contacts on the package substrate with at least some of the plurality of resonators being opposite the one or more areas.

In various further Examples, the first level interconnects include solder having a melting point below 180 degrees Celsius.

Example 24 provides a quantum computing device that includes a quantum processing device, a non-quantum processing device, and a memory device. The quantum processing device may include a die coupled to a package substrate by first level interconnects disposed between the die and the package substrate. The die may include a plurality of superconducting qubits disposed on the first face of the die, a plurality of resonators disposed on the first face of the die, and a plurality of conductive pathways coupled between conductive contacts at the first face of the die and associated ones of the plurality of superconducting qubits or associated ones of the plurality of resonators. The non-quantum processing device may be coupled to the quantum processing device at least partially via the package substrate and be used to control electrical signals applied to the plurality of superconducting qubits or/and the plurality of resonators. The memory device may be configured to store data generated by the plurality of superconducting qubits or/and the plurality of resonators during operation of the quantum processing device.

Example 25 provides the quantum computing device according to Example 24, where the memory device is to store instructions for a quantum computing algorithm to be executed by the quantum processing device.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

The invention claimed is:
1. A superconducting qubit device package, comprising:
a die having a first face and an opposing second face, the die comprising:
  a superconducting qubits over the first face of the die,
  a resonator over the first face of the die, and
  a plurality of conductive pathways coupled between conductive contacts at the first face of the die and one or more of the superconducting qubit and the resonator; and
a package substrate having a first face and an opposing second face, wherein conductive contacts are at the second face of the package substrate; and
first level interconnects between the first face of the die and the second face of the package substrate, the first level interconnects coupling the conductive contacts at the first face of the die with associated conductive contacts at the second face of the package substrate,
wherein:
  the conductive contacts at the second face of the package substrate are coupled to two or more conductive layers of a metallization stack at the second face of the package substrate,
  the metallization stack includes the two or more conductive layers separated from one another by dielectric layers, and
  at least a dielectric material of at least one of the dielectric layers is at least partially recessed in an area of the metallization stack that is opposite at least a portion of the resonator.

2. The superconducting qubit device package according to claim 1, wherein each of the two or more conductive layers and each of the dielectric layers has a thickness between 0.2 and 0.3 micrometers.

3. The superconducting qubit device package according to claim 1, wherein the metallization stack is removed in the area.

4. The superconducting qubit device package according to claim 1, wherein the each of the two or more conductive layers includes one or more superconductive materials.

5. The superconducting qubit device package according to claim 1, wherein the die is a first die, and wherein the superconducting qubit device package further includes:
  a second die having a first face and an opposing second face, wherein the second die includes one or more conductive contacts at the first face of the second die; and
  additional first level interconnects between the first face of the second die and the second face of the package substrate, the additional first level interconnects coupling the conductive contacts at the first face of the second die with associated conductive contacts at the second face of the package substrate.

6. The superconducting qubit device package according to claim 1, wherein the package substrate and the die include a same material.

7. The superconducting qubit device package according to claim 1, wherein the first level interconnects include a solder, and the solder includes one or more of indium, bismuth or gallium.

8. The superconducting qubit device package according to claim 1, wherein the first level interconnects include a solder having a melting point that is less than 180 degrees Celsius.

9. The superconducting qubit device package according to claim 1, wherein the at least one of the dielectric layers is closer to the first face of the die than the two or more conductive layers of the metallization stack.

10. The superconducting qubit device package according to claim 1, wherein the at least one of the dielectric layers is closer to the first face of the die than other dielectric layers of the metallization stack.

11. The superconducting qubit device package according to claim 1, wherein the dielectric material of the at least one of the dielectric layers is absent in the area.

12. The superconducting qubit device package according to claim 1, wherein, in the area, a conductive material of one of the two or more conductive layers of the metallization stack faces the portion of the resonator.

13. The superconducting qubit device package according to claim 1, wherein the plurality of conductive pathways includes a flux bias line coupled between the conductive contacts at the first face of the die and the superconducting qubit.

14. The superconducting qubit device package according to claim 13, wherein the first level interconnects are to enable provision of current, from a control logic to the flux bias line, for tuning a resonant frequency of the superconducting qubit.

15. The superconducting qubit device package according to claim 1, wherein the plurality of conductive pathways includes a drive line coupled between the conductive contacts at the first face of the die and the superconducting qubit.

16. The superconducting qubit device package according to claim 15, wherein the first level interconnects are to enable provision of current, from a control logic to the drive line, for controlling a quantum state of the superconducting qubit.

17. The superconducting qubit device package according to claim 1, wherein the plurality of conductive pathways includes a readout line coupled between the conductive contacts at the first face of the die and the resonator.

18. The superconducting qubit device package according to claim 17, wherein the first level interconnects enable a control logic to detect current in the readout line, for detecting a quantum state the superconducting qubit.

19. A method of manufacturing a superconducting qubit device package, the method comprising:
  forming a recess in a portion of a face of a package substrate; and
  providing first level interconnects between conductive contacts on the face of the package substrate and conductive contacts on a face of a die that includes one or more superconducting qubits and a resonator so that the recess is opposite at least a portion of the resonator.

20. The method according to claim 19, further comprising, prior to providing first level interconnects,
  coupling the conductive contacts on the face of the package substrate to two or more conductive layers of a metallization stack at the face of the package substrate, and
  forming the recess to ensure absence of a dielectric material or the metallization stack in the portion of the face of the package substrate.

21. The method according to claim 19, wherein a depth of the recess is at least 200 nanometers.

22. A quantum computing device, comprising:
  a quantum processing device, wherein the quantum processing device includes a die coupled to a package substrate by first level interconnects between the die and the package substrate, wherein the die includes a plurality of superconducting qubits and a plurality of resonators;
  a non-quantum processing device, coupled to the quantum processing device at least partially via the package substrate, to control electrical signals applied to the plurality of superconducting qubits or/and the plurality of resonators; and
  a memory device to store data generated by the plurality of superconducting qubits or/and the plurality of resonators during operation of the quantum processing device,
  wherein:
  each of the die and the package substrate has a first face and an opposing second face,
  the plurality of superconducting qubits and the plurality of resonators are on the first face of the die,
  the first level interconnects couple the first face of the die and the second face of the package substrate,
  a metallization stack is at the second face of the package substrate,
  the metallization stack includes two or more conductive layers separated from one another by dielectric layers, and
  the metallization stack is at least partially recessed in an area that is opposite at least a portion of the plurality of resonators.

23. The quantum computing device according to claim 22, wherein the metallization stack is absent in the area.

24. The quantum computing device according to claim 22, wherein the memory device is to store instructions for a quantum computing algorithm to be executed by the quantum processing device.

25. The quantum computing device according to claim 22, wherein a conductive material of the two or more conductive layers of the metallization stack is exposed in the area where the metallization stack is recessed.

26. The quantum computing device according to claim 22, wherein a conductive material of the two or more conductive layers of the metallization stack faces the first face of the die in the area where the metallization stack is recessed.

* * * * *

UNITED STATES PATENT AND TRADEMARK OFFICE
CERTIFICATE OF CORRECTION

PATENT NO. : 11,569,428 B2
APPLICATION NO. : 16/347097
DATED : January 31, 2023
INVENTOR(S) : Jeanette M. Roberts et al.

It is certified that error appears in the above-identified patent and that said Letters Patent is hereby corrected as shown below:

On the Title Page

In Item (73), under "Assignee", in Column 1, Line 1, delete "Santa Clara" and insert -- Intel Corporation, Santa Clara, CA (US) --, therefor.

In the Claims

In Column 32, Claim 1, Line 42, delete "qubits" and insert -- qubit --, therefor.

In Column 34, Claim 18, Line 11, delete "state the" and insert -- state of the --, therefor.

Signed and Sealed this
Seventh Day of March, 2023

Katherine Kelly Vidal
*Director of the United States Patent and Trademark Office*